United States Patent
Yonezawa

(10) Patent No.: US 10,305,488 B2
(45) Date of Patent: May 28, 2019

(54) CIRCUIT DEVICE, OSCILLATOR, ELECTRONIC APPARATUS, AND VEHICLE

(71) Applicant: SEIKO EPSON CORPORATION, Tokyo (JP)

(72) Inventor: Takemi Yonezawa, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 216 days.

(21) Appl. No.: 15/385,325

(22) Filed: Dec. 20, 2016

(65) Prior Publication Data

US 2017/0194967 A1    Jul. 6, 2017

(30) Foreign Application Priority Data

Jan. 6, 2016    (JP) .................... 2016-001302
Jul. 12, 2016    (JP) .................... 2016-137665

(51) Int. Cl.
| | |
|---|---|
| H03L 1/02 | (2006.01) |
| H03B 5/36 | (2006.01) |
| H03L 1/00 | (2006.01) |
| H03L 7/085 | (2006.01) |
| H03L 7/099 | (2006.01) |
| H03L 7/14 | (2006.01) |

(52) U.S. Cl.
CPC .......... *H03L 1/026* (2013.01); *H03B 5/362* (2013.01); *H03B 5/368* (2013.01); *H03L 1/00* (2013.01); *H03L 1/028* (2013.01); *H03L 7/085* (2013.01); *H03L 7/099* (2013.01); *H03L 7/0991* (2013.01); *H03L 7/14* (2013.01); *H03L 2207/50* (2013.01)

(58) Field of Classification Search
CPC ....................................................... H03L 1/026
USPC ............................................................ 331/1 A
See application file for complete search history.

(56) References Cited

U.S. PATENT DOCUMENTS

| | | | | |
|---|---|---|---|---|
| 5,144,595 A | * | 9/1992 | Graham | G01S 15/46 367/135 |
| 5,697,082 A | * | 12/1997 | Greer | G04G 7/00 331/44 |
| 6,711,230 B1 | * | 3/2004 | Nicholls | G04G 3/00 327/147 |

FOREIGN PATENT DOCUMENTS

JP    2015-082815 A    4/2015

* cited by examiner

*Primary Examiner* — Joseph Chang
(74) *Attorney, Agent, or Firm* — Oliff PLC

(57) ABSTRACT

A circuit device includes an oscillation signal generation circuit that generates an oscillation signal having an oscillation frequency set by the frequency control data by using a resonator, and a processor that is configured to perform a signal process on input frequency control data to output frequency control data. The processor is configured to obtain a pre-estimated value x^−(k) at a time step k by adding a post-estimated value x^(k−1) and a correction value D(k−1) at a time step k−1 together during a process of updating a pre-estimated value in a Kalman filter process, and perform aging correction on the frequency control data on the basis of a result of the Kalman filter process.

14 Claims, 20 Drawing Sheets

| PLLLOCK | KFEN | $\hat{x}(k)$ |
|---|---|---|
| 0 | 0 | DFCI (THROUGH OUTPUT) |
| 0 | 1 | HOLD PREVIOUS OUTPUT STATE |
| 1 | 0 | DFCI (THROUGH OUTPUT) |
| 1 | 1 | TRUE VALUE ESTIMATION PROCESS (KALMAN FILTER PROCESS) |

CIRCUIT DEVICE, OSCILLATOR, ELECTRONIC APPARATUS, AND VEHICLE

CROSS-REFERENCE TO RELATED APPLICATIONS

The present application claims priority to Japanese Patent Application JP 2016-001302, filed Jan. 6, 2016, and JP 2016-137665, filed Jul. 12, 2016, the entire disclosure of which are hereby incorporated by reference herein.

BACKGROUND

1. Technical Field

Various embodiments of the present invention relates to a circuit device, an oscillator, an electronic apparatus, and a vehicle.

2. Related Art

In the related art, there is an oscillator such as an oven controlled crystal oscillator (OCXO) or a temperature compensated crystal oscillator (TCXO). For example, the OCXO is used as a reference signal source in a base station, a network router, a measurement apparatus, and the like.

High frequency stability is required in an oscillator such as the OCXO or the TCXO. However, a secular change called aging occurs in an oscillation frequency of an oscillator, and thus the oscillation frequency varies over time. For example, regarding the related art of reducing a variation in an oscillation frequency in a case where a reference signal such as a GPS signal cannot be received, and thus a so-called hold-over state occurs, there is a technique disclosed in JP-A-2015-82815. In this related art, there are provided a storage which stores correspondence relationship information (aging characteristic data) between a correction value of a control voltage for an oscillation frequency and the elapsed time, and an elapsed time measurer. In a case where a hold-over state is detected, aging correction is performed on the basis of the correspondence relationship information between a correction value and the elapsed time stored in the storage, and the elapsed time measured by the elapsed time measurer.

However, in the technique of the related art, as a storage storing correspondence relationship information between a correction value and the elapsed time, a storage having a large storage capacity is necessary, and thus there is a problem in that a size of a circuit device increases. For example, in order to realize more highly accurate aging correction, it is necessary to store a larger data amount of correspondence relationship information in a storage, and thus a size of the circuit device increases.

SUMMARY

An advantage of some aspects of the invention is to provide a circuit device, an oscillator, an electronic apparatus, a vehicle, and the like, capable of realizing more highly accurate aging correction with a smaller-sized circuit.

An aspect of the invention relates to a circuit device including a processor that performs a signal process on frequency control data; and an oscillation signal generation circuit that generates an oscillation signal having an oscillation frequency set by the frequency control data by using the frequency control data from the processor and a resonator, in which the processor performs a process of obtaining a pre-estimated value at the present timing by adding a post-estimated value and a correction value at the previous timing together during a process of updating a pre-estimated value in a Kalman filter process, and performs aging correction on the frequency control data on the basis of a result of the Kalman filter process.

According to the aspect of the invention, the processor performs a signal process on frequency control data, and an oscillation signal having an oscillation frequency set by the frequency control data is generated by using the frequency control data from the processor and a resonator. In the aspect of the invention, during a process of updating a pre-estimated value in a Kalman filter process, a pre-estimated value at the present timing is obtained by adding a post-estimated value and a correction value at the previous timing together. Aging correction is performed on the frequency control data on the basis of a result of the Kalman filter process. In the above-described way, for example, compared with a case of using an extended Kalman filter process, it is possible to reduce a processing load on the processor or to suppress an increase in a size of the circuit device. Therefore, it is possible to realize more highly accurate aging correction with a smaller-sized circuit.

In the aspect of the invention, the processor may obtain the correction value on the basis of an observation residual in the Kalman filter process.

With this configuration, it is possible to realize aging correction by using a correction value which is updated to reflect the observation residual in the Kalman filter process, and thus to perform more highly accurate aging correction.

In the aspect of the invention, the processor may add the post-estimated value $\hat{x}(k-1)$ and the correction value $D(k-1)$ at the time step $k-1$ which is the previous timing together, and thus obtain the pre-estimated value $\hat{x}^-(k)$ at the time step $k$ which is the present timing according to $\hat{x}^-(k)=\hat{x}(k-1)+D(k-1)$.

With this configuration, the pre-estimated value $\hat{x}^-(k)$ at the time step $k$ can be obtained through a simple calculation process in which a processing load is small, such as $\hat{x}^-(k)=\hat{x}(k-1)+D(k-1)$, and thus it is possible to achieve a small-sized circuit device.

In the aspect of the invention, the processor may obtain the correction value $D(k)$ at the time step $k$ on the basis of the correction value $D(k-1)$ at the time step $k-1$ and an observation residual in the Kalman filter process.

With this configuration, it is possible to realize aging correction by using the correction value $D(k)$ in which an observation residual in the Kalman filter process is reflected and which is updated at each time step.

In the aspect of the invention, in a case where the observation residual is indicated by $e_k$, and a constant is indicated by $E$, the processor may obtain the correction value $D(k)$ according to $D(k)=D(k-1)+E \cdot e_k$.

With this configuration, the correction value $D(k)$ can be obtained through a simple calculation process such as $D(k)=D(k-1)+E \cdot e_k$, and thus it is possible to reduce a processing load on the processor.

In the aspect of the invention, the circuit device may further include a storage that stores the constant $E$.

With this configuration, for example, it is possible to realize a process of updating the correction value $D(k)=D(k-1)+E \cdot e_k$ by using the appropriate constant $E$ corresponding to each product, and thus to realize more highly accurate aging correction.

In the aspect of the invention, the processor may perform the signal process on the frequency control data based on a phase comparison result between an input signal based on the oscillation signal and a reference signal, perform a process of estimating a true value for an observed value of the frequency control data based on the phase comparison result through the Kalman filter process in a period before a hold-over state due to the absence or abnormality of the reference signal is detected, and hold the true value at a timing corresponding to a timing of detecting the hold-over state in a case where the hold-over state is detected, and performs a calculation process based on the true value so as to generate the frequency control data having undergone aging correction.

With this configuration, it is possible to realize aging correction on the basis of a true value which is estimated through a Kalman filter process and is held at a timing corresponding to a hold-over detection timing. Therefore, it is possible to realize highly accurate aging correction which cannot be realized in the related art.

In the aspect of the invention, the processor may perform the calculation process of adding the correction value to the true value so as to generate the frequency control data having undergone aging correction.

With this configuration, aging correction is realized, for example, by performing a calculation process of adding a correction value for compensating for a frequency change at an aging rate to a true value which is estimated through a Kalman filter process. Therefore, it is possible to realize highly accurate aging correction with a simple process.

In the aspect of the invention, the processor may perform the calculation process of adding the correction value having undergone a filter process to the true value.

With this configuration, it is possible to effectively prevent the accuracy of aging correction from being reduced due to a correction value having a change fluctuation being added to a true value.

In the aspect of the invention, the circuit device may further include a storage that stores a system noise constant for setting system noise in the Kalman filter process and an observation noise constant for setting observation noise in the Kalman filter process.

With this configuration, it is possible to realize aging correction in which the influence of detection variations in system noise or observation noise is reduced.

In the aspect of the invention, the circuit device may further include a digital interface that monitors the pre-estimated value and an observed value.

With this configuration, for example, an external device such as an inspection device can monitor a pre-estimated value or an observed value via the digital interface. Consequently, it is possible to perform a setting process which causes an observation error corresponding to a difference between an observed value and a pre-estimated value to be reduced.

Another aspect of the invention relates to an oscillator including any of the circuit devices described above; and the resonator.

Still another aspect of the invention relates to an electronic apparatus including any of the circuit devices described above.

Yet another aspect of the invention relates to a vehicle including any of the circuit devices described above.

BRIEF DESCRIPTION OF THE DRAWINGS

Various embodiments of the invention will be described with reference to the accompanying drawings, wherein like numbers reference like elements.

DESCRIPTION OF EXEMPLARY EMBODIMENTS

Hereinafter, one or more embodiments of the invention will be described in detail. The one or more embodiments described below are not intended to improperly limit the various embodiments of the invention disclosed in the appended claims, and all constituent elements described in the one or more embodiments are not essential as solving means of all of the embodiments the invention.

1. Oscillation Frequency Change Due to Aging

In an oscillator such as an OCXO or a TCXO, an oscillation frequency changes due to a secular change called aging. There is a difference in a behavior of aging change in an oscillation frequency between individual oscillators due to individual variations (hereinafter, referred to as element variations) in performance of a component forming an oscillator, a mounting state of a component or an oscillator, or a use environment of an oscillator.

Figure 1:
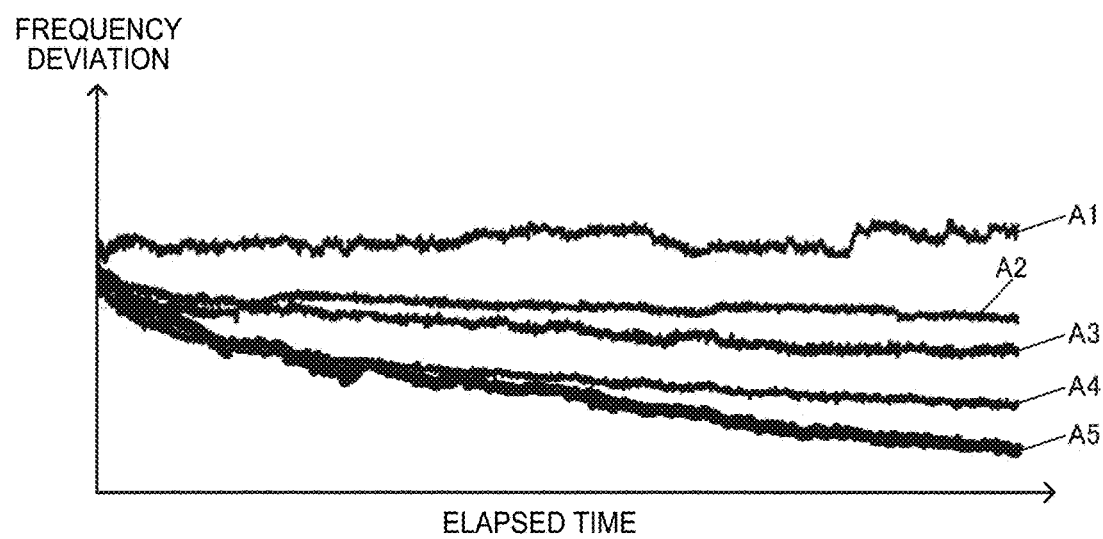
FIG. 1 is a diagram for explaining element variations in aging characteristics.

A1 to A5 in FIG. 1 indicate examples of measurement results of aging characteristics of a plurality of oscillators whose shipment lots are the same as or different from each other. As indicated by A1 to A5 in FIG. 1, there are differences caused by element variations in aspects of aging change.

As causes of an oscillation frequency change due to aging, there may be attachment and detachment of dust to and from an oscillator in an airtight sealing container, an environmental change caused by a certain outgas, or a secular change of an adhesive used in an oscillator.

Regarding a countermeasure for reducing an oscillation frequency change due to aging, there is a method in which initial aging is performed so that an oscillator is operated for a predetermined period before shipment thereof, and thus an oscillation frequency is initially changed. However, in an application requiring high frequency stability, only such an initial aging countermeasure is not sufficient, and aging correction for compensating for an oscillation frequency change due to aging is desirable.

In a case where an oscillator is used as a reference signal source of a base station, there is a problem such as so-called hold-over. For example, in a base station, an oscillation signal (output signal) from an oscillator is synchronized with a reference signal from a GPS or a network by using a PLL circuit, and thus a frequency change is reduced. However, in a case where a hold-over state occurs in which the reference signal from a GPS or a network (Internet) is absent or abnormal, a reference signal for synchronization cannot be obtained. For example, in a GPS, in a case where a positioning signal cannot be received due to an installation position or an installation direction of a GPS antenna, an accurate positioning signal cannot be received due to interference waves, or a positioning signal is not transmitted from a positioning satellite, a hold-over state occurs, and thus a synchronization process using a reference signal cannot be performed.

If such a hold-over state occurs, an oscillation signal generated through self-running oscillation of an oscillator is used as a reference signal of a base station. Therefore, there is the need for hold-over performance of reducing an oscillation frequency change due to self-running oscillation of an oscillator in a hold-over period from an occurrence timing of the hold-over state to a recovery timing (cancel timing) from the hold-over state.

However, as described above, there is an oscillation frequency change in a level which cannot be ignored in an oscillator, and this causes a problem that it is hard to realize high hold-over performance. For example, in a case where an allowable frequency deviation ($\Delta f/f$) is specified in a hold-over period such as 24 hours, if a great oscillation frequency change occurs due to aging, there is concern that satisfy the allowable frequency deviation specification may not be satisfied.

For example, as a communication method between a base station and a communication terminal, various methods such as frequency division duplex (FDD) or time division duplex (TDD) have been proposed. In the TDD method, data is transmitted and received in a time division manner by using the same frequency in uplink and downlink, and a guard time is set between time slots allocated to respective apparatuses. Thus, it is necessary for each apparatus to perform time synchronization in order to realize appropriate communication, and thus an accurate absolute time is required to be measured. In other words, since it is necessary to provide a plurality of base stations in order to realize a wireless communication system in a wide area in a mobile phone or a terrestrial digital broadcast, if measured times between the base stations are different from each other, appropriate communication cannot be realized. Meanwhile, in a case where a hold-over state occurs in which a reference signal from a GPS or a network is absent or abnormal, an oscillator side is required to measure an absolute time without a reference signal, and thus communication collapses if measured times are different from each other. Thus, it is necessary for an oscillator used in a base station or the like to have very high frequency stability, even in a hold-over period. Therefore, aging correction for compensating for a frequency change due to aging is also required to be performed with high accuracy.

2. Configuration of Circuit Device

Figure 2:
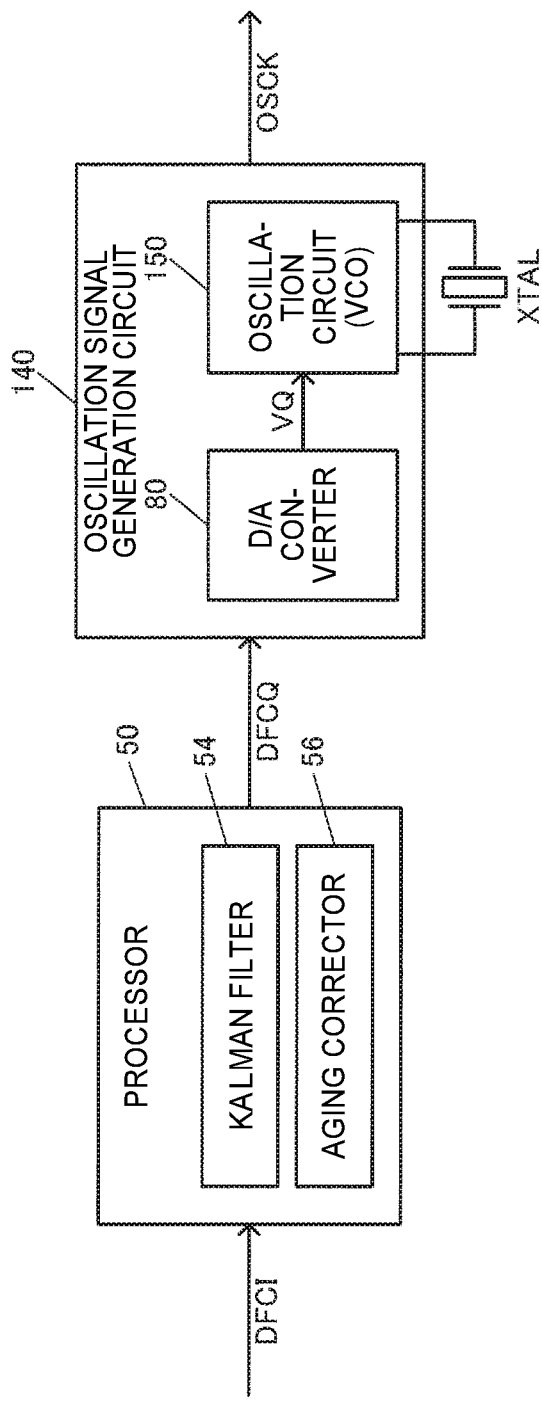
FIG. 2 is a diagram illustrating a fundamental configuration example of a circuit device according to an embodiment of the invention.

FIG. 2 illustrates a fundamental circuit configuration of a circuit device of the present embodiment. As illustrated in FIG. 2, the circuit device of the present embodiment includes a processor 50 and an oscillation signal generation circuit 140. A configuration of the circuit device is not limited to the configuration illustrated in FIG. 2, and may be variously modified by omitting some constituent elements or adding other constituent elements thereto.

The processor 50 performs various signal processes. A signal process is performed on frequency control data DFCI (frequency control code). Specifically, the processor 50 (digital signal processor) performs signal processes (digital signal processes) such as an aging correction process and a Kalman filter process, and a temperature compensation process as necessary. Frequency control data DFCQ (frequency control code) having undergone the signal process is output. The processor 50 may include a Kalman filter 54 (a Kalman filter processing circuit or program module), and an aging corrector 56 (an aging correction processing circuit or program module). The processor 50 may be implemented by an ASIC circuit such as a gate array, and may be implemented by a processor (a DSP or a CPU) and a program (program module) operating on the processor.

A resonator XTAL is, for example, an AT cut or SC cut quartz crystal resonator which is of a thickness shear vibration type, or a flexural vibration type piezoelectric resonator. The resonator XTAL is of a type of being provided in a thermostatic tank of an oven type oscillator (OCXO), but is not limited thereto, and may be a resonator for a TCXO not provided with a thermostatic tank. The resonator XTAL may be a resonator (an electromechanical resonator or an electrical resonance circuit). As the resonator XTAL, a surface acoustic wave (SAW) resonator as a piezoelectric resonator, a micro electro mechanical system (MEMS) resonator as a silicon resonator, and the like may be used. As a substrate metal of the resonator XTAL, a piezoelectric single crystal of quartz crystal, Lithium Tantalate, or Lithium Niobate, a piezoelectric material such as piezoelectric ceramics of lead zirconate titanate or the like, or a silicon semiconductor material may be used. The resonator XTAL may be excited due to a piezoelectric effect, and may be excited by using electrostatic driving based on a Coulomb force.

The oscillation signal generation circuit 140 generates an oscillation signal OSCK. For example, the oscillation signal generation circuit 140 generates the oscillation signal OSCK of an oscillation frequency set on the basis of the frequency control data DFCQ by using the frequency control data DFCQ (frequency control data having undergone a signal process) from the processor 50 and the resonator XTAL. As an example, the oscillation signal generation circuit 140 causes the resonator XTAL to oscillate at an oscillation frequency set by the frequency control data DFCQ and thus to generate the oscillation signal OSCK.

The oscillation signal generation circuit 140 may be a circuit which generates the oscillation signal OSCK according to a direct digital synthesizer method. For example, the oscillation signal OSCK having an oscillation frequency set on the basis of the frequency control data DFCQ may be digitally generated by using an oscillation signal from the resonator XTAL (an oscillation source with a fixed oscillation frequency) as a reference signal.

The oscillation signal generation circuit 140 may include a D/A converter 80 and an oscillation circuit 150. However, a configuration of the oscillation signal generation circuit 140 is not limited to such a configuration, and may be variously modified by omitting some constituent elements or adding other constituent elements thereto.

The D/A converter 80 performs D/A conversion on the frequency control data DFCQ (output data from the processor) from the processor 50. The frequency control data DFCQ which is input to the D/A converter 80 is frequency control data (frequency control code) having undergone signal processes (for example, an aging correction process, a temperature compensation process, or a Kalman filter process) in the processor 50. As a D/A conversion type of the D/A converter 80, a resistance string type (resistance division type) may be employed. However, a D/A conversion type is not limited thereto, and various types such as a resistance ladder type (R-2R ladder type or the like), a capacitor array type, and a pulse width modulation type may be employed. The D/A converter 80 may include a control circuit, a modulation circuit (a dithering circuit or a PWM circuit), a filter circuit, or the like, in addition a D/A converter.

The oscillation circuit 150 generates the oscillation signal OSCK by using an output voltage VQ from the D/A converter 80, and the resonator XTAL. The oscillation circuit 150 is connected to the resonator XTAL via first and second resonator terminals (resonator pads). For example, the oscillation circuit 150 causes the resonator XTAL (a piezoelectric resonator, a resonator, or the like) to oscillate so as to generate the oscillation signal OSCK. Specifically, the oscillation circuit 150 causes the resonator XTAL to oscillate at an oscillation frequency at which the output voltage VQ of the D/A converter 80 is used as a frequency control voltage (oscillation control voltage). For example, in a case where the oscillation circuit 150 is a circuit (VCO) which controls oscillation of the resonator XTAL through voltage control, the oscillation circuit 150 may include a variable capacitance capacitor (varicap or the like) whose capacitance value varies depending on a frequency control voltage.

As described above, the oscillation circuit 150 may be implemented using a direct digital synthesizer method, and, in this case, an oscillation frequency of the resonator XTAL is used as a reference frequency and is different from an oscillation frequency of the oscillation signal OSCK.

As mentioned above, the circuit device of the present embodiment includes the processor 50 which performs signal processes on the frequency control data DFCI, and the oscillation signal generation circuit 140 which generates the oscillation signal OSCK having an oscillation frequency set on the basis of the frequency control data DFCQ by using the frequency control data DFCQ from the processor 50 and the resonator XTAL.

The processor 50 performs a process of obtaining a pre-estimated value at the present timing by adding a post-estimated value and a correction value at the previous timing together, in a process of updating a pre-estimated value during a Kalman filter process. Aging correction is performed on frequency control data on the basis of results of the Kalman filter process. The addition process in the present embodiment includes a subtraction process of adding a negative value.

In other words, in the Kalman filter process, a state is estimated by repeatedly performing observation update and time update. In the observation update, a Kalman gain, a post-estimated value, and a post-covariance are updated on the basis of observed values and results of the time update. In the time update, a prediction process of obtaining a pre-estimated value and a pre-covariance at the present timing (time step k) is performed on the basis of results of the observation update.

Figure 3:
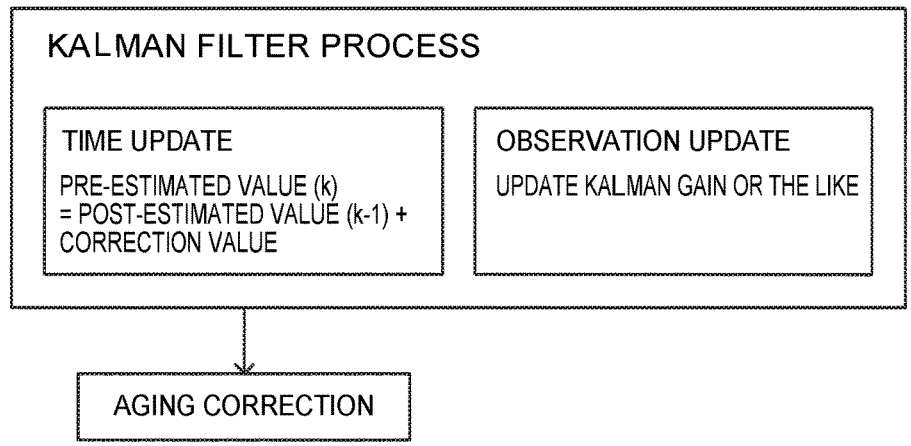
FIG. 3 is a diagram for explaining a technique according to an embodiment of the invention.

In the present embodiment, as illustrated in FIG. 3, the processor 50 obtains a pre-estimated value at the present timing (time step k) by adding a post-estimated value and a correction value at the previous timing (time step k−1) together during the time update of updating a pre-estimated value in the Kalman filter process. Aging correction is performed on frequency control data on the basis of results (for example, a true value, or the true value and a correction value) of the Kalman filter process.

In this case, the processor 50 obtains the correction value on the basis of an observation residual in the Kalman filter process. The observation residual corresponds to a difference between an observed value and a pre-estimated value. For example, a prediction process of obtaining a pre-estimated value at the present timing is performed by adding a correction value obtained through an update process based on the observation residual in the Kalman filter process to a post-estimated value at the previous timing. In the above-described way, it is possible to realize aging correction by using a correction value which is updated to reflect the observation residual in the Kalman filter process, and thus to perform more highly accurate aging correction.

Figure 4:
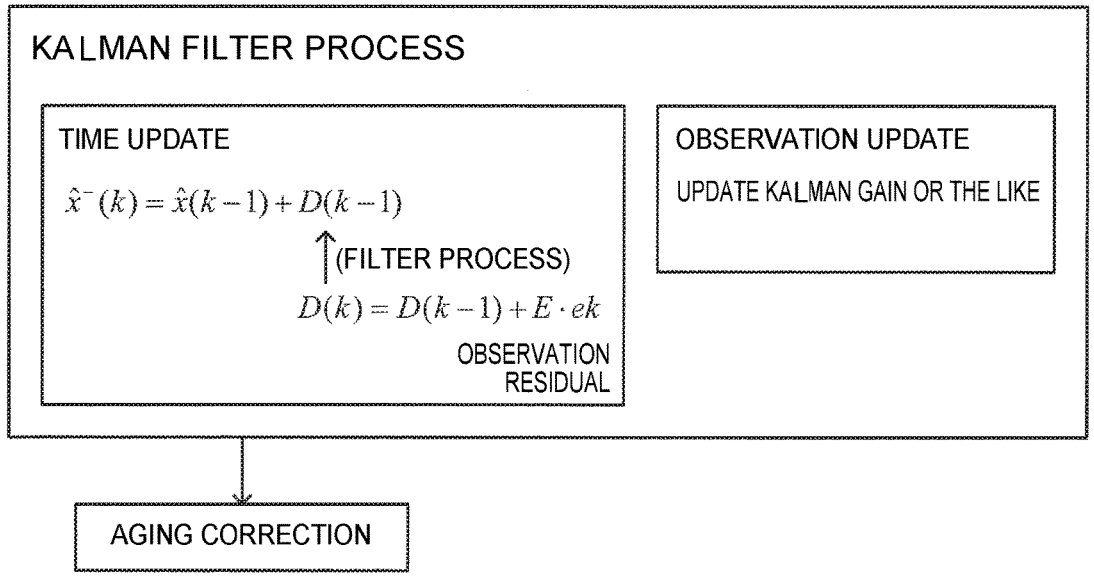
FIG. 4 is a diagram for explaining a technique according to an embodiment of the invention.

More specifically, as illustrated in FIG. 4, the processor 50 adds a post-estimated value $\hat{x}(k-1)$ and a correction value $D(k-1)$ at a time step k−1 which is the previous timing together, so as to obtain a pre-estimated value $\hat{x}^-(k-1)$ at the time step k which is the present timing according to $\hat{x}^-(k)=\hat{x}(k-1)+D(k-1)$. Here, the hat symbol "^" indicating an estimated value is arranged with two letters as appropriate.

In other words, as will be described later, in a normal Kalman filter process, the pre-estimated value $\hat{x}^-(k)$ at the time step k is obtained through the time update process according to $\hat{x}^-(k)=A\hat{x}(k-1)$. Here, A correlates a state of the system at the time step k with a state of the system at a time step k+1 in a case where there is no system noise, and is called a system matrix. In this case, in order to obtain an accurate value of A, a process called an extended Kalman filter process is required to be performed.

The extended Kalman filter process may require a considerable processing load. If the extended Kalman filter process is to be realized, a circuit area of the processor 50 tends to increase, and this is not appropriate in a situation in which the circuit device built into an oscillator is strongly required to be small-sized. On the other hand, if fixed values are used as values of A, it is difficult to realize appropriate aging correction.

Therefore, in order to solve this problem, in the present embodiment, as will be described later in detail, a time update process is performed so as to obtain the pre-estimated value $x\hat{\ }^-(k)$ at the time step k by using $x\hat{\ }^-(k)=x\hat{\ }(k-1)+D(k-1)$ instead of $x\hat{\ }^-(k)=Ax\hat{\ }(k-1)$. This process of using $x\hat{\ }^-(k)=x\hat{\ }(k-1)+D(k-1)$ may be realized through a process, requiring a small load, of adding a correction value D(k-1) to the post-estimated value $x\hat{\ }(k-1)$. Therefore, it is not necessary to use the extended Kalman filter process requiring a large load, and thus it is possible to reduce a processing load on the processor 50 or to suppress an increase in a size of the circuit device. In other words, it is possible to realize more highly aging correction with a smaller-sized circuit.

In the present embodiment, as illustrated in FIG. 4, the processor 50 obtains the correction value D(k) at the time step k by using the correction value D(k-1) at the time step k-1 and an observation residual in the Kalman filter process. Specifically, in a case where an observation residual is indicated by ek, and a constant is indicated by E, the correction value D(k) is obtained according to D(k)=D(k-1)+E·ek. In a case where a Kalman gain is indicated by G(k), the correction value D(k) may be obtained according to D(k)=D(k-1)+G(k)·ek. Here, in a case where an observed value is indicated by y(k), the observation residual may be expressed as ek=y(k)-$x\hat{\ }^-(k)$.

For example, as will be described later, the correction value D(k) is a correction value for canceling and compensating for a frequency change at an aging rate corresponding to an inclination indicated by C3 in FIG. 10. The aging rate changes over time as is clear from A1 to A5 in FIG. 1 or FIG. 10. Therefore, if a fixed value is used as a correction value in aging correction, appropriate aging correction cannot be realized.

In relation to this fact, in the present embodiment, a process of updating a correction value in the aging correction is performed on the basis of an observation residual in the Kalman filter process, such as D(k)=D(k-1)+E·ek. Therefore, even in a case where an aging rate changes over time as in A1 to A5 in FIG. 1 or FIG. 10, a correction value for compensating for a frequency change at the changing aging rate can be obtained through a process of updating D(k)=D(k-1)+E·ek. Therefore, it is possible to realize more highly aging correction with a smaller-sized circuit.

The constant E in D(k)=D(k-1)+E·ek is preferably stored in a storage 34 illustrated in FIG. 9 which will be described later. For example, during manufacturing and shipment of products (oscillators), the constant E suitable for a product is written and stored in the storage 34 formed of, for example, a nonvolatile memory. In the above-described way, it is possible to realize a process of updating D(k)=D(k-1)+E·ek by using the constant E suitable for each product, and thus it is possible to realize more highly accurate aging correction.

3. Hold-Over

Figure 5:
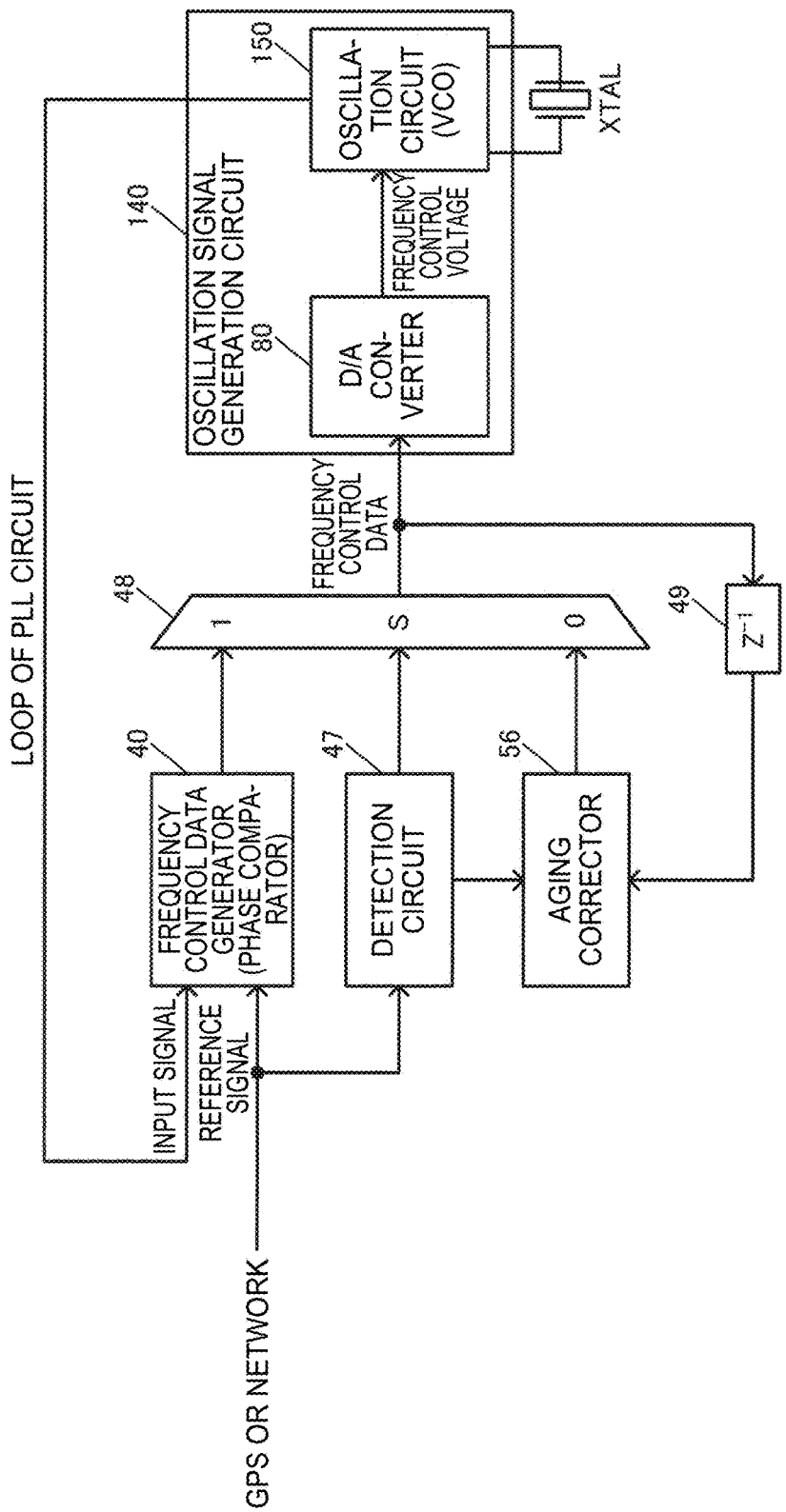
FIG. 5 is a diagram for explaining aging correction during hold-over.

Next, hold-over will be described in detail. FIG. 5 is a diagram for explaining aging correction during hold-over. A frequency control data generator 40 compares (comparison operation) a phase of an input signal (input clock signal) based on an oscillation signal with a phase of a reference signal (reference clock signal) from a GPS or a network, so as to generate frequency control data. A selector 48 outputs the frequency control data from the frequency control data generator 40 to the oscillation signal generation circuit 140 during a normal operation. The D/A converter 80 of the oscillation signal generation circuit 140 converts the frequency control data into a frequency control voltage which is then output to the oscillation circuit 150. The oscillation circuit 150 causes the resonator XTAL to oscillate at an oscillation frequency corresponding to the frequency control voltage, so as to generate an oscillation signal. A loop of a PLL circuit is formed by the frequency control data generator 40 and the oscillation signal generation circuit 140, and thus the input signal based on the oscillation signal can be synchronized with the reference signal.

A detection circuit 47 performs an operation of detecting the reference signal so as to detect a hold-over state in which the reference signal is absent or abnormal. If the hold-over state is detected, the aging corrector 56 performs aging correction for compensating for a frequency change due to aging, on the frequency control data held in a register 49. The oscillation signal generation circuit 140 causes the resonator XTAL to oscillate at an oscillation frequency corresponding to the frequency control data having undergone the aging correction, so as to generate an oscillation signal. Consequently, the oscillation signal during self-running oscillation can be supplied as a reference signal source for an electronic apparatus of a base station or the like.

Figure 6:
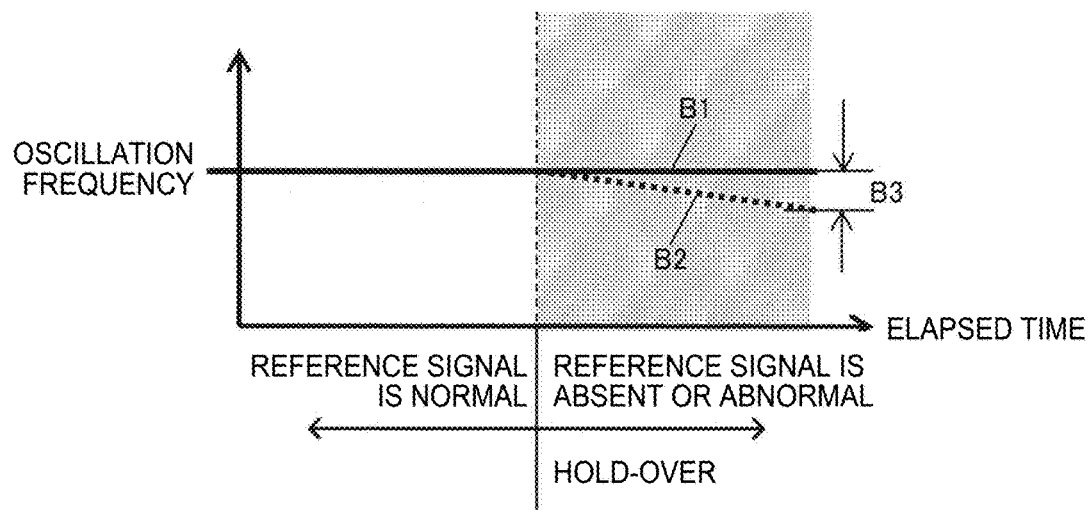
FIG. 6 is a diagram for explaining a hold-over state.
Figure 7:
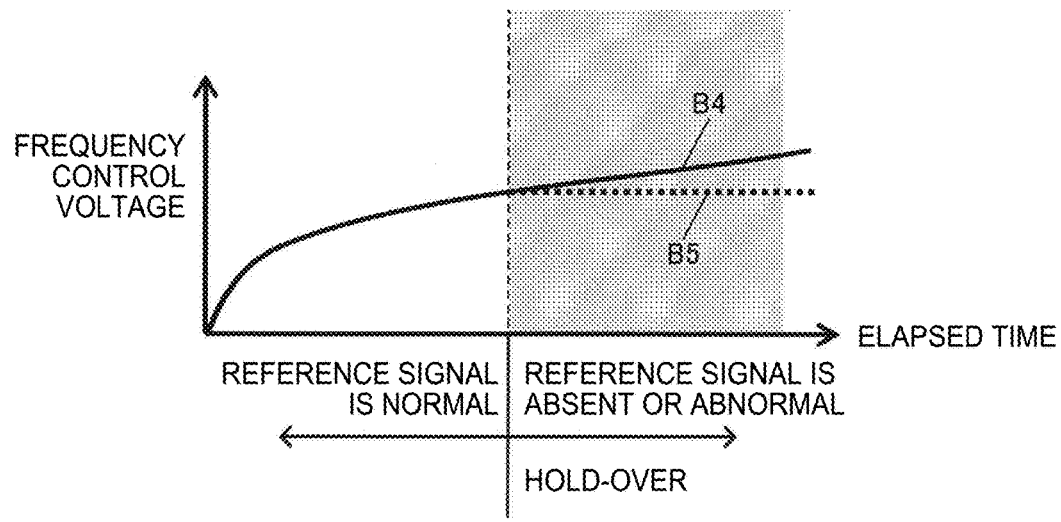
FIG. 7 is a diagram for explaining a hold-over state.

B1 in FIG. 6 indicates an aging characteristic of an ideal oscillation frequency in a case where a hold-over state occurs. On the other hand, B2 (dotted line) indicates a characteristic in which an oscillation frequency changes due to aging. B3 indicates a change width of the oscillation frequencies due to the aging. B4 in FIG. 7 indicates transition of a frequency control voltage for approaching the characteristic indicated by B1 in a case where a hold-over state occurs. On the other hand, B5 (dotted line) indicates a state in which the frequency control voltage is constant from the time at which the absence or abnormality of the reference signal occurs.

The aging correction is performed in order to cause the characteristic indicated by B2 in FIG. 6 to be close to the ideal characteristic indicated by B1. For example, if the reference value is changed as indicated by B4 in FIG. 7 through the aging correction, the characteristic indicated by B2 in FIG. 6 can be made to be close to the ideal characteristic indicated by B1, and thus the characteristic indicated by B2 can be corrected to the ideal characteristic indicated by B1 by increasing the correction accuracy. On the other hand, in a case where aging correction is not performed as indicated by B5 in FIG. 7, an oscillation frequency changes in a hold-over period as indicated by B2 in FIG. 6. Thus, for example, if a requirement for hold-over performance is B1 in FIG. 6, the requirement cannot be satisfied.

For example, the hold-over time $\theta_{tot}$ indicating a time deviation amount (total amount) based on an oscillation frequency change in a hold-over period may be expressed as in the following Equation (1).

$$\theta_{tot} = T_1 \times f_0 \times \frac{\Delta f}{f_0} \times \frac{1}{f_0} \times \frac{1}{2} \qquad (1)$$
$$= T_1 \times \frac{\Delta f}{f_0} \times \frac{1}{2}$$

-continued $$\frac{\Delta f}{f_0} = \frac{2 \times \theta_{tot}}{T_1}. \qquad (2)$$

Here, $T_1$ indicates elapsed time of aging due to hold-over. In addition, $f_0$ indicates a nominal oscillation frequency, and $\Delta f/f_0$ indicates a frequency deviation. In the above Equation (1), $T_1 \times f_0$ indicates a total number of clocks, and $(\Delta f/f_0) \times (1/f_0)$ indicates a timing deviation amount at one clock. The frequency deviation $\Delta f/f_0$ may be expressed as in the above Equation (2) by using the hold-over time $\theta_{tot}$ and the elapsed time $T_1$.

Figure 8:
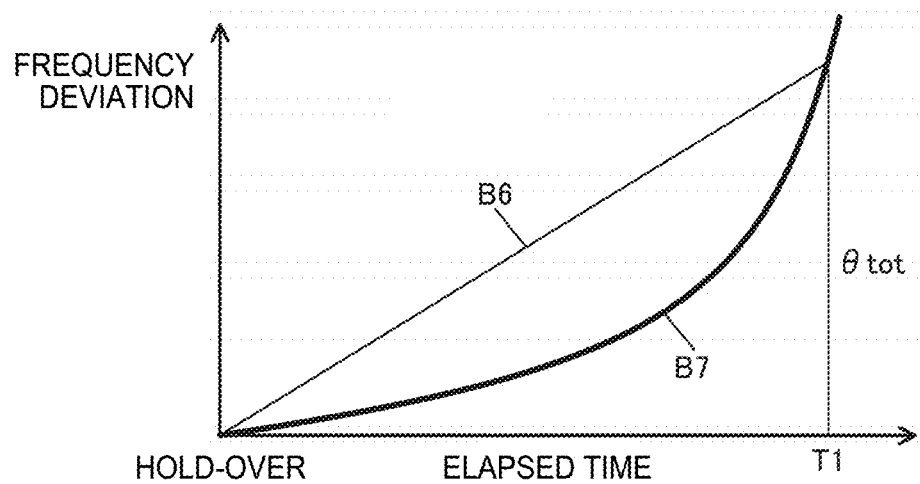
FIG. 8 is a diagram for explaining a hold-over state.

As indicated by B6 in FIG. 8, the frequency deviation $\Delta f/f_0$ is assumed to linearly change with a constant inclination over time. In this case, as indicated by B7 in FIG. 8, as the elapsed time $T_1$ increases, the hold-over time $\theta_{tot}$ quadratically increases.

For example, in a case of a TDD method, in order to prevent time slots in which the guard time is set from overlapping each other, the hold-over time is required to be, for example, $\theta_{tot}<1.5$ μs. Therefore, as is clear from the above Equation (2), an allowable frequency deviation $\Delta f/f_0$ in an oscillator is required to have a very small value. Particularly, this allowable frequency deviation is required to have a smaller value as the elapsed time $T_1$ increases. For example, in a case where the time defined as a period from an occurrence timing of a hold-over state to a recovery timing from the hold-over state through maintenance work is, for example, $T_1=24$ hours, a very small value has to be used as the allowable frequency deviation. The frequency deviation $\Delta f/f_0$ includes, for example, a temperature-dependent frequency deviation and a frequency deviation due to aging, and thus it is necessary to perform considerably highly accurate aging correction in order to satisfy the requirement.

4. Detailed Configuration Example of Circuit Device

Figure 9:
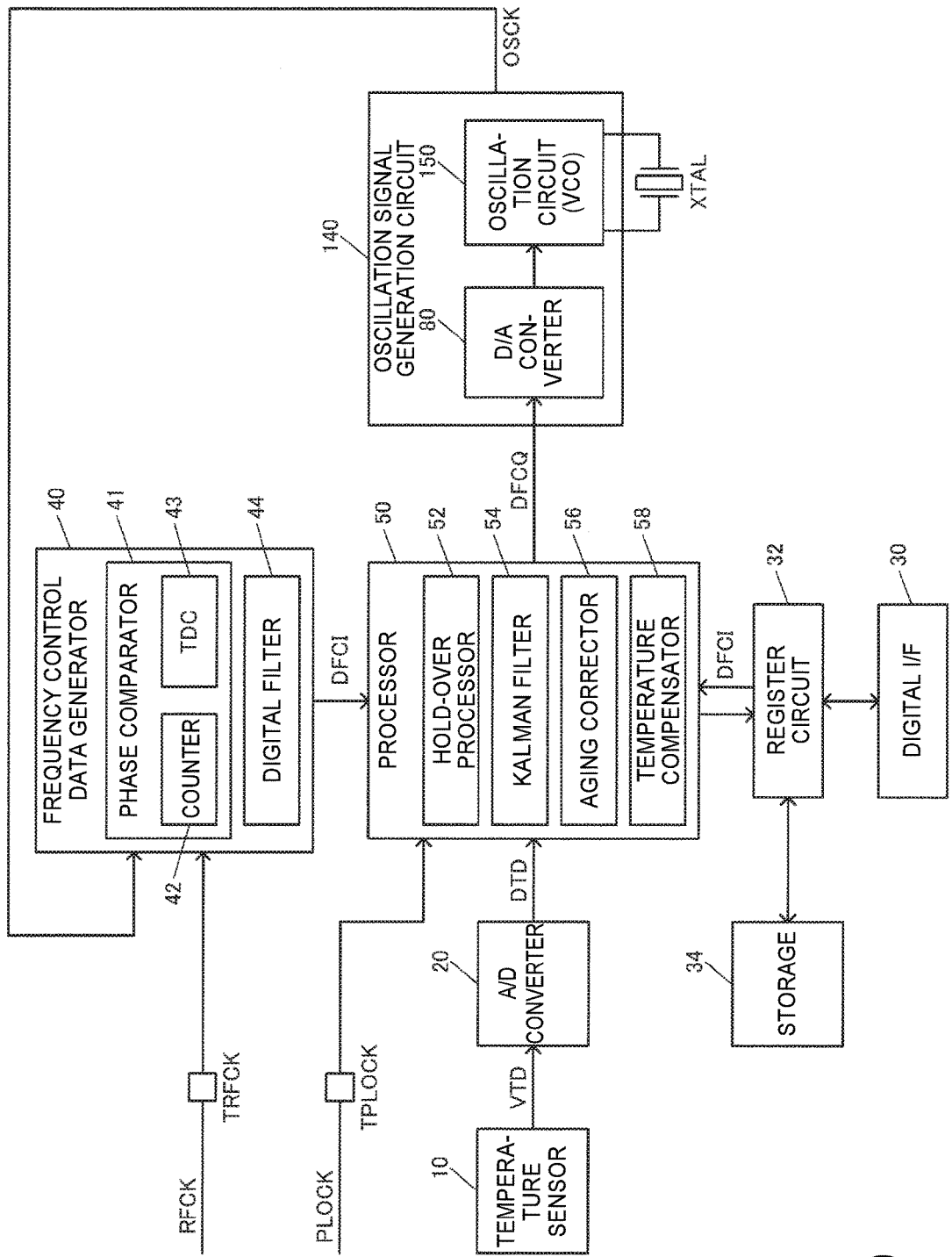
FIG. 9 is a diagram illustrating a detailed configuration example of the circuit device according to an embodiment of the invention.

FIG. 9 illustrates a detailed configuration example of the circuit device of the present embodiment. In FIG. 9, a temperature sensor 10, an A/D converter 20, a digital interface 30, a register circuit 32, the storage 34, and the frequency control data generator 40 (in a broad sense, a phase comparator) are additionally provided in the configurations illustrated in FIG. 2. A configuration of the circuit device is not limited to the configuration illustrated in FIG. 9, and may be variously modified by omitting some constituent elements (for example, the frequency control data generator) or adding other constituent elements thereto. For example, as the temperature sensor 10, a temperature sensor provided outside the circuit device may be used.

The temperature sensor 10 outputs a temperature detection voltage VTD. Specifically, a temperature-dependent voltage which changes depending on the temperature of the environment (circuit device) is output as the temperature detection voltage VTD. A specific configuration example of the temperature sensor 10 will be described later.

The A/D converter 20 performs A/D conversion on the temperature detection voltage VTD from the temperature sensor 10 so as to output temperature detection data DTD. For example, the digital temperature detection data DTD (A/D result data) corresponding to an A/D conversion result of the temperature detection voltage VTD is output. As an A/D conversion method in the A/D converter 20, for example, a successive comparison method or a method similar to the successive comparison method may be employed. An A/D conversion method is not limited to such methods, and various methods (a counting type, a parallel comparison type, and a series/parallel type) may be employed.

The digital interface 30 is an interface for inputting and outputting digital data between the circuit device and an external device (for example, a microcomputer or a controller). The digital interface 30 may be implemented on the basis of, for example, a synchronous serial communication method using serial clock lines and serial data lines. Specifically, the digital interface 30 may be implemented on the basis of an inter-integrated circuit (I2C) method or a 3-wire or 4-wire serial peripheral interface (SPI) method. The I2C method is a synchronous serial communication method of performing communication by using two signal lines such as a serial clock line SCL and a bidirectional serial data line SDA. A plurality of slaves are connected to an I2C bus, a master designates a separately set address of a slave so as to select the slave, and then performs communication with the slave. The SPI method is a synchronous serial communication method of performing communication by using a serial clock line SCK and two unidirectional serial data lines SDI and SDO. A plurality of slaves are connected to a SPI bus, and a master is required to select a slave by using a slave select line in order to specify the slave. The digital interface 30 is formed of an input/output buffer circuit, a control circuit, and the like realizing such a communication method.

The register circuit 32 is a circuit formed of a plurality of registers such as a status register, a command register, and a data register. An external device of the circuit device accesses each register of the register circuit 32 via the digital interface 30. The external device can check a status of the circuit device, issue a command to the circuit device, transmit data to the circuit device, and read data from the circuit device, by using the register of the register circuit 32.

The storage 34 stores various pieces of information which is necessary in various processes or operations of the circuit device. The storage 34 may be implemented by, for example, a nonvolatile memory. As the nonvolatile memory, for example, an EEPROM may be used. For example, a metal-oxide-nitride-oxide-silicon (MONOS) type memory may be used as the EEPROM. For example, a flash memory using the MONOS type memory may be used. Alternatively, memories of other types such as a floating gate type may be used as the EEPROM. The storage 34 may be implemented by, for example, a fuse circuit as long as information can be held and stored even in a state in which power is not supplied.

In this case, the processor 50 further includes a hold-over processor 52 (a hold-over processing circuit or program module) and a temperature compensator 58 (a temperature compensation processing circuit or program module) in addition to the Kalman filter 54 and the aging corrector 56. The hold-over processor 52 performs various processes regarding hold-over. The temperature compensator 58 (processor 50) performs a temperature compensation process on an oscillation frequency on the basis of the temperature detection data DTD from the A/D converter 20. Specifically, the temperature compensator 58 performs a temperature compensation process for reducing an oscillation frequency change in a case where a temperature change occurs on the basis of the temperature detection data DTD (temperature-dependent data) which changes depending on a temperature, and coefficient data (coefficient data of an approximate function) for the temperature compensation process.

The reference signal RFCK is input to the circuit device via the terminal TRFCK (pad) which is an external condition terminal of the circuit device. The signal PLOCK for performing a notification of whether or not an external PLL circuit is in a lock state is input to the circuit device via the terminal TPLOCK (pad) which is an external connection terminal of the circuit device.

The storage 34 stores a system noise constant (V) for setting system noise in a Kalman filter process and an observation noise constant (W) for setting observation noise in the Kalman filter process. For example, measurement (inspection) is performed in order to monitor various pieces of information such as an oscillation frequency during manufacturing and shipment of products (oscillator and the like). A system noise constant or an observation noise constant is determined on the basis of the measurement results, and is written to the storage 34 implemented by, for example, a nonvolatile memory. In the above-described way, it is possible to set a system noise constant or an observation noise constant on which an element variation has a reduced adverse effect.

In this case, the circuit device of the present embodiment includes the digital interface 30 which monitors a pre-estimated value and an observed value. In other words, an external device monitors the pre-estimated value $x^{\sim}(k)$ or the observed value $y(k)$ in a Kalman filter process via the digital interface 30.

Specifically, during manufacturing and shipment of products, an inspection device as an external device monitors the pre-estimated value $x^{\wedge}(k)$ or the observed value $y(k)$ via the digital interface 30. For example, in the Kalman filter 54 illustrated in FIG. 20 which will be described later, the inspection device monitors a signal value of a node for the pre-estimated value $x^{\sim}(k)$ or a signal value of a node for the observed value $y(k)$ via the digital interface 30. For example, a monitor register for monitoring a signal value of a node for the pre-estimated value $x^{\sim}(k)$ or a signal value of a node for the observed value $y(k)$ is provided in the register circuit 32. The inspection device accesses the monitor register via the digital interface 30 so as to acquire the pre-estimated value $x^{\sim}(k)$ or the observed value $y(k)$.

The inspection device can obtain, for example, the observation residual $ek=y(k)-x^{\sim}(k)$ on the basis of the acquired pre-estimated value $x^{\sim}(k)$ and the observed value $y(k)$. The system noise constant V or the observation noise constant W for reducing the observation residual ek is obtained. Alternatively, the constant E which is the optimum in a calculation process of the $D(k)=D(k-1)+E \cdot ek$ is obtained. The obtained system noise constant V, observation noise constant W, or constant E is written to the storage 34 in an inspection step during manufacturing and shipment of products. In the above-described way, the constant V, W or E optimal for each product can be written to the storage 34. During a normal operation, the Kalman filter process of the present embodiment is performed by using the constant V, W or E, and thus it is possible to realize more highly accurate aging correction.

The frequency control data generator 40 generates the frequency control data DFCI. For example, the frequency control data DFCI is generated by comparing an input signal based on the oscillation signal OSCK with the reference signal RFCK. The generated frequency control data DFCI is input to the processor 50. Here, the input signal based on the oscillation signal OSCK may be the oscillation signal OSCK, and may be a signal (for example, a signal obtained through division) generated from the oscillation signal OSCK. Hereinafter, a case where an input signal is the oscillation signal OSCK will be mainly described as an example.

The frequency control data generator 40 includes a phase comparator 41 and a digital filter 44. The phase comparator 41 (phase calculator) is a circuit performing phase comparison (comparison calculation) between the oscillation signal OSCK and the reference signal RFCK which are input signals, and includes a counter 42 and a time digital converter (TDC) 43.

The counter 42 generates digital data corresponding to an integer part of a result obtained by dividing a reference frequency (for example, 1 Hz) of the reference signal RFCK by an oscillation frequency of the oscillation signal OSCK. The TDC 43 generates digital data corresponding to a decimal part of the division result. The TDC 43 includes, for example, a plurality of delay elements; a plurality of latch circuits which latch a plurality of delayed clock signals output from the plurality of delay elements at edge (high) timings of the reference signal RFCK; and a circuit which generates digital data corresponding to a decimal part of a division result by coding output signals from the plurality of latch circuits. The phase comparator 41 adds the digital data corresponding to the integer part from the counter 42 to the digital data corresponding to the decimal part from the TDC 43, so as to detect a phase error with respect to a set frequency. The digital filter 44 performs a smoothing process on the phase error so as to generate the frequency control data DFCI. For example, in a case where a frequency of the oscillation signal OSCK is indicated by FOS, a frequency of the reference signal RFCK is indicated by FRF, and a division number (division ratio) corresponding to a set frequency is indicated by FCW, the frequency control data DFCI is generated so as to satisfy a relationship of FOS=FCW×FRF. Alternatively, the counter 42 may count the number of clocks of the oscillation signal OSCK. In other words, the counter 42 performs a counting operation with an input signal based on the oscillation signal OSCK. The phase comparator 41 may compare a counted value in the counter 42 in n cycles (where n is an integer of 2 or greater) of the reference signal RFCK with an expected value (n×FCW) corresponding to the counted value in integers. For example, a difference between an expected value and a counted value in the counter 42 is output from the phase comparator 41 as phase error data.

A configuration of the frequency control data generator 40 is not limited to the configuration illustrated in FIG. 9, and may be variously modified. For example, the phase comparator 41 may be formed of a phase comparator of an analog circuit, or the digital filter 44 may be formed of a filter (loop filter) of an analog circuit and an A/D converter. The process (the smoothing process on phase error data) in the digital filter 44 may be performed by the processor 50. For example, the processor 50 performs the process in the digital filter 44 along with other processes (a hold-over process, a Kalman filter process, and the like) in a time division manner. For example, the processor 50 performs a filter process (smoothing process) on a phase comparison result (phase error data) in the phase comparator 41.

In FIG. 9, the frequency control data generator 40 is built into the circuit device, but the frequency control data generator may be a circuit provided outside the circuit device. In this case, the frequency control data DFCI may be input to the processor 50 from the frequency control data generator provided outside the circuit device, via the digital interface 30.

As mentioned above, in the present embodiment, the processor 50 performs signal processes on the frequency control data DFCI based on a phase comparison result between an input signal based on the oscillation signal OSCK and the reference signal RFCK. In other words, the processor 50 performs a signal process on the frequency control data DFCI based on a phase comparison result from the phase comparator 41. For example, the frequency control data DFCI is input to the processor 50 from the frequency control data generator 40 which compares an input signal based on the oscillation signal OSCK with the reference signal RFCK so as to generate the frequency control data DFCI. The processor 50 may receive a phase comparison result from the phase comparator 41, and may perform a filter process (the process in the digital filter 44) on the phase comparison result. The processor 50 performs a process of estimating a true value for an observed value of the frequency control data DFCI based on the phase comparison result through a Kalman filter process in a period before a hold-over state caused by the absence or abnormality of the reference signal RFCK is detected. This true value is a true value estimated through the Kalman filter process, and thus cannot be said to be a real true value. The Kalman filter process is performed by the Kalman filter 54. A control process performed due to detection of a hold-over state is performed by the hold-over processor 52.

In a case where a hold-over state is detected, the processor 50 holds a true value at a timing corresponding to a timing of detecting the hold-over state. A timing of holding the true value may be a timing of detecting the hold-over state, and may be a timing before the timing. The processor 50 performs a predetermined calculation process on the basis of the true value so as to generate the frequency control data DFCQ having undergone aging correction (aging-corrected frequency control data). The generated frequency control data DFCQ is output to the oscillation signal generation circuit 140. The process of generating the frequency control data DFCQ having undergone aging correction is performed by the aging corrector 56.

For example, in a normal operation period, the processor 50 performs a signal process such as a temperature compensation process on the frequency control data DFCI, and outputs the frequency control data DFCQ having undergone the signal process to the oscillation signal generation circuit 140. The oscillation signal generation circuit 140 generates the oscillation signal OSCK by using the frequency control data DFCQ from the processor 50 and the resonator XTAL, and outputs the generated oscillation signal OSCK to the frequency control data generator 40 (phase comparator 41). Consequently, a loop of a PLL circuit is formed by the frequency control data generator 40 (phase comparator 41), the oscillation signal generation circuit 140, and the like, thereby being capable of generating the accurate oscillation signal OSCK phase-synchronized with the reference signal RFCK.

In the present embodiment, even in the normal operation period before a hold-over state is detected, the Kalman filter 54 of the processor 50 operates to perform a Kalman filter process on the frequency control data DFCI. In other words, a process of estimating a true value for an observed value of the frequency control data DFCI through the Kalman filter process is performed.

If a hold-over state is detected, a true value at a timing corresponding to a detection timing of the hold-over state is held in the processor 50. Specifically, the aging corrector 56 holds the true value. The aging corrector 56 performs a calculation process on the basis of the held true value so as to generate the frequency control data DFCQ having undergone aging correction.

In the above-described way, aging correction is performed on the basis of the true value at the timing corresponding to the timing of detecting the hold-over state, and thus it is possible to considerably improve the accuracy of the aging correction. In other words, it is possible to realize aging correction in which the influence of observation noise or system noise is taken into consideration.

In a case where the oscillation signal generation circuit 140 is recovered from hold-over, the oscillation signal generation circuit 140 generates the oscillation signal OSCK on the basis of the frequency control data DFCQ based on a phase comparison result. For example, the oscillation signal OSCK is generated on the basis of the frequency control data DFCQ which is input from the frequency control data generator 40 (phase comparator 41) via the processor 50. For example, if an absence state or an abnormality state of the reference signal RFCK disappears, a hold-over state is canceled, and thus recovery from hold-over occurs. In this case, an operation of the circuit device returns to a normal operation. The oscillation signal generation circuit 140 generates the oscillation signal OSCK on the basis of the frequency control data DFCQ (frequency control data having undergone a signal process such as a temperature compensation process) which is input from the frequency control data generator 40 via the processor 50 instead of the frequency control data DFCQ which is generated by performing aging correction in the processor 50.

The processor 50 performs a calculation process (a calculation process of compensating for a frequency change caused by aging) of adding a correction value to the held true value, and thus generates the frequency control data DFCQ having undergone aging correction. For example, correction values (correction values for canceling a frequency change at an aging rate) corresponding to the aging rate (an aging gradient or an aging coefficient) are sequentially added to the true value at the timing corresponding to the detection timing of the hold-over state every predetermined timing, and thus the frequency control data DFCQ having undergone aging correction is generated.

For example, a correction value at a time step k is indicated by D(k), and frequency control data having undergone aging correction is indicated by AC(k). In this case, the processor 50 obtains frequency control data AC(k+1) having undergone aging correction at a time step k+1 according to AC(k+1)=AC(k)+D(k). The processor 50 performs such a process of adding the correction value D(k) at each time step till a recovery timing (cancel timing) from the time of hold-over.

The processor 50 performs a calculation process of adding a correction value having undergone a filter process to the true value. For example, a filter process such as a low-pass filter process is performed on the correction value D(k), and a calculation process of sequentially adding correction value D'(k) having undergone the filter process to the true value is performed. Specifically, a calculation process is performed according to AC(k+1)=AC(k)+D'(k).

The processor 50 obtains the correction value on the basis of an observation residual in the Kalman filter process. For example, the processor 50 performs a process of estimating a correction value in aging correction on the basis of an observation residual in a period before a hold-over state is detected. For example, if an observation residual is indicated by ek, the correction value D(k) is estimated by performing a process according to D(k)=D(k−1)+E·ek. Here, E is, for example, a constant, but a Kalman gain may be used instead of the constant E. A correction value at a timing corresponding to a detection timing of a hold-over state is held, a calculation process of adding the held correction value to the true value, and thus the frequency control data DFCQ having undergone aging correction is generated.

The processor 50 determines whether or not a hold-over state is detected on the basis of a voltage of an input terminal to which the hold-over detection signal is input, or hold-over detection information which is input via the digital interface 30. This determination process is performed by the hold-over processor 52. The hold-over processor 52 includes a circuit related to a state machine, and state transition of the state machine is performed on the basis of various signals or information. If it is determined that a hold-over state is detected on the basis of a voltage of the input terminal to which the hold-over detection signal is input, or the hold-over detection information which is input via the digital interface 30, a state of the state machine transitions to a hold-over state. Various processes (aging correction and the like) related to the hold-over state are performed.

A hold-over detection signal may be, for example, the reference signal RFCK or a signal PLOCK. In this case, the processor 50 determines whether or not a hold-over state has occurred on the basis of a voltage of a terminal TRFCK to which the reference signal RFCK is input, or a voltage of a terminal TPLOCK to which the signal PLOCK is input.

For example, in a case where a PLL circuit is formed by the frequency control data generator 40 provided inside the circuit device, it may be determined whether or not a hold-over state has occurred on the basis of a voltage of the terminal TRFCK to which the reference signal RFCK is input. For example, in a case where it is detected that the reference signal RFCK is absent or abnormal on the basis of a voltage of the terminal TRFCK, the processor 50 determines that a hold-over state has occurred.

On the other hand, in a case where a PLL circuit is formed by a frequency control data generator provided outside the circuit device, it may be determined that a hold-over state has occurred on the basis of a voltage of the terminal TPLOCK to which the signal PLOCK is input. For example, an external device (a device controlling an external PLL circuit) outputs the signal PLOCK for performing a notification of whether or not the external PLL circuit is in a lock state, to the circuit device. For example, in a case where it is determined that the external PLL circuit is not in a lock state on the basis of the signal PLOCK, the processor 50 determines that a hold-over state has occurred. It may be determined whether or not a hold-over state has occurred by also using the reference signal RFCK in addition to the signal PLOCK. The external PLL circuit is a PLL circuit formed of, for example, a frequency control data generator provided outside the circuit device, the oscillation signal generation circuit 140 of the circuit device, and the like.

For example, in a case where a PLL circuit is formed by the frequency control data generator provided outside the circuit device, it may be determined whether or not a hold-over state has occurred on the basis of hold-over state detection information which is input via the digital interface 30. For example, in a case where it is determined that the external PLL circuit is in a hold-over state due to the absence or abnormality of the reference signal, an external device (for example, a microcomputer) controlling the external PLL circuit sets hold-over detection information in a register (notification register) of the register circuit 32 via the digital interface 30. The processor 50 reads the hold-over detection information set in the register element so as to determine whether or not a hold-over state has occurred. In the above-described way, a new hold-over detection terminal is not required to be provided, and thus it is possible to reduce the number of terminals of the circuit device.

5. Aging Correction Using Kalman Filter Process

In the present embodiment, an aging correction technique using a Kalman filter process is employed. Specifically, in the present embodiment, the processor 50 estimates a true value for an observed value of frequency control data (oscillation frequency) through a Kalman filter process in a period before a hold-over state is detected. In a case where a hold-over state is detected, a true value at a timing (time point) corresponding to a timing of detecting the hold-over state is held, a calculation process based on the true value is performed, and thus aging correction is realized.

Figure 10:
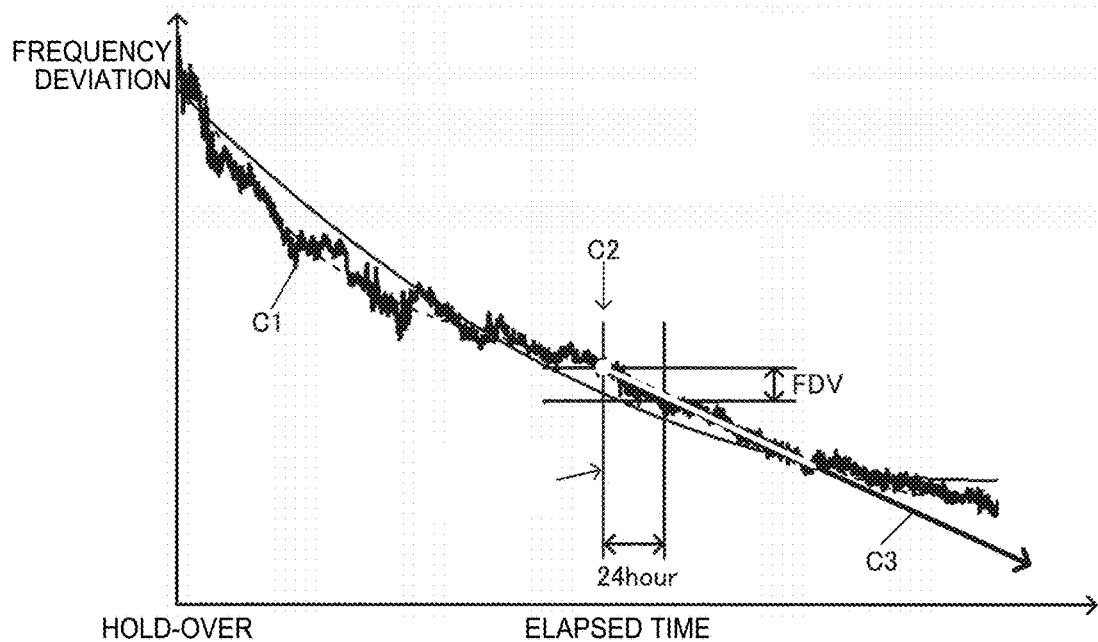
FIG. 10 is a diagram for explaining aging correction using a Kalman filter process.

FIG. 10 is a diagram illustrating results of measuring an oscillation frequency change due to aging. A transverse axis expresses the elapsed time (aging time), and a longitudinal axis expresses the frequency deviation ($\Delta f/f_0$) of an oscillation frequency. As indicated by C1 in FIG. 10, there are large variations caused by system noise or observation noise in measured values which are observed values. These variations also include a variation caused by the environmental temperature.

In a situation in which there are large variations in the observed values, state estimation using a Kalman filter process (for example, a linear Kalman filter process) is performed in order to obtain an accurate true value.

Figure 11:
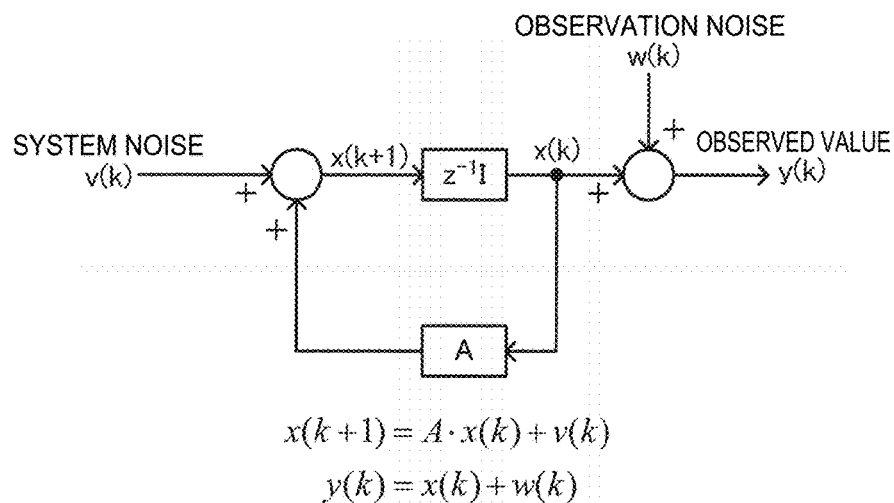
FIG. 11 is a diagram for explaining aging correction using a Kalman filter process.

FIG. 11 illustrates a time-series state space model, and discrete time state equations of this model are given by a state equation and an observation equation of the following (3) and (4).

$$x(k+1)=A \cdot x(k)+v(k) \quad (3)$$

$$y(k)=x(k)+w(k) \quad (4)$$

Here, x(k) indicates a state at a time point k, and y(k) indicates an observed value. In addition, v(k) indicates system noise, w(k) indicates observation noise, and A is a system matrix. In a case where x(k) indicates an oscillation frequency (frequency control data), A corresponds to, for example, an aging rate (aging coefficient). The aging rate indicates a change rate of the oscillation frequency with respect to the elapsed time.

For example, it is assumed that a hold-over state occurs at a timing indicated by C2 in FIG. 10. In this case, aging correction is performed on the basis of a true value x(k) at the time point C2 at which the reference signal RFCK is stopped, and an aging rate (A) corresponding to an inclination indicated by C3 in FIG. 10. Specifically, as compensation (correction) for reducing a frequency change at the aging rate indicated by C3, aging correction of sequentially changing the true value x(k) of the oscillation frequency (frequency control data) at the time point C2 with a correction value for canceling the frequency change is performed. In other words, the true value x(k) is changed with a correction value for canceling a frequency change at the aging rate as indicated by B2 in FIG. 6 and causing an ideal characteristic as indicated by B1. In this way, for example, in a case where a hold-over period is 24 hours, FDV in FIG. 10 corresponding to an oscillation frequency change after 24 hours elapses can be compensated for through the aging correction.

Here, the oscillation frequency change (frequency deviation) indicated by C1 in FIG. 10 is caused by a temperature change and aging. Therefore, in the present embodiment, for example, an oven type oscillator (OCXO) having a thermostatic tank is employed, and thus an oscillation frequency change caused by a temperature change is minimized. A temperature compensation process for reducing an oscillation frequency change caused by a temperature change is performed by using the temperature sensor 10 or the like illustrated in FIG. 9.

In a period (normal operation period) in which the PLL circuit (the internal PLL circuit or the external PLL circuit) is synchronized with the reference signal RFCK, frequency control data (frequency control code) is monitored, and a true value obtained by removing an error (system noise or observation noise) is obtained, and is held in the register. In a case where unlocking of the PLL circuit occurs due to the absence or abnormality of the reference signal RFCK, aging correction is performed on the basis of a true value (a true value for an observed value of frequency control data) held at the time of the unlocking. For example, regarding compensation for reducing a frequency change at the aging rate corresponding to an inclination indicated by C3 in FIG. 10, for example, a process of sequentially adding correction values for canceling the frequency change to the held true value of the frequency control data is performed, thus the frequency control data DFCQ during self-running oscillation in a hold-over period is generated, and the resonator XTAL is made to oscillate. In the above-described way, since a true value at the time of entering hold-over can be obtained at the minimum error, and aging correction can be performed, it is possible to realize hold-over performance in which an adverse effect due to an aging change is minimized.

6. Configuration of Processor

Figure 12:
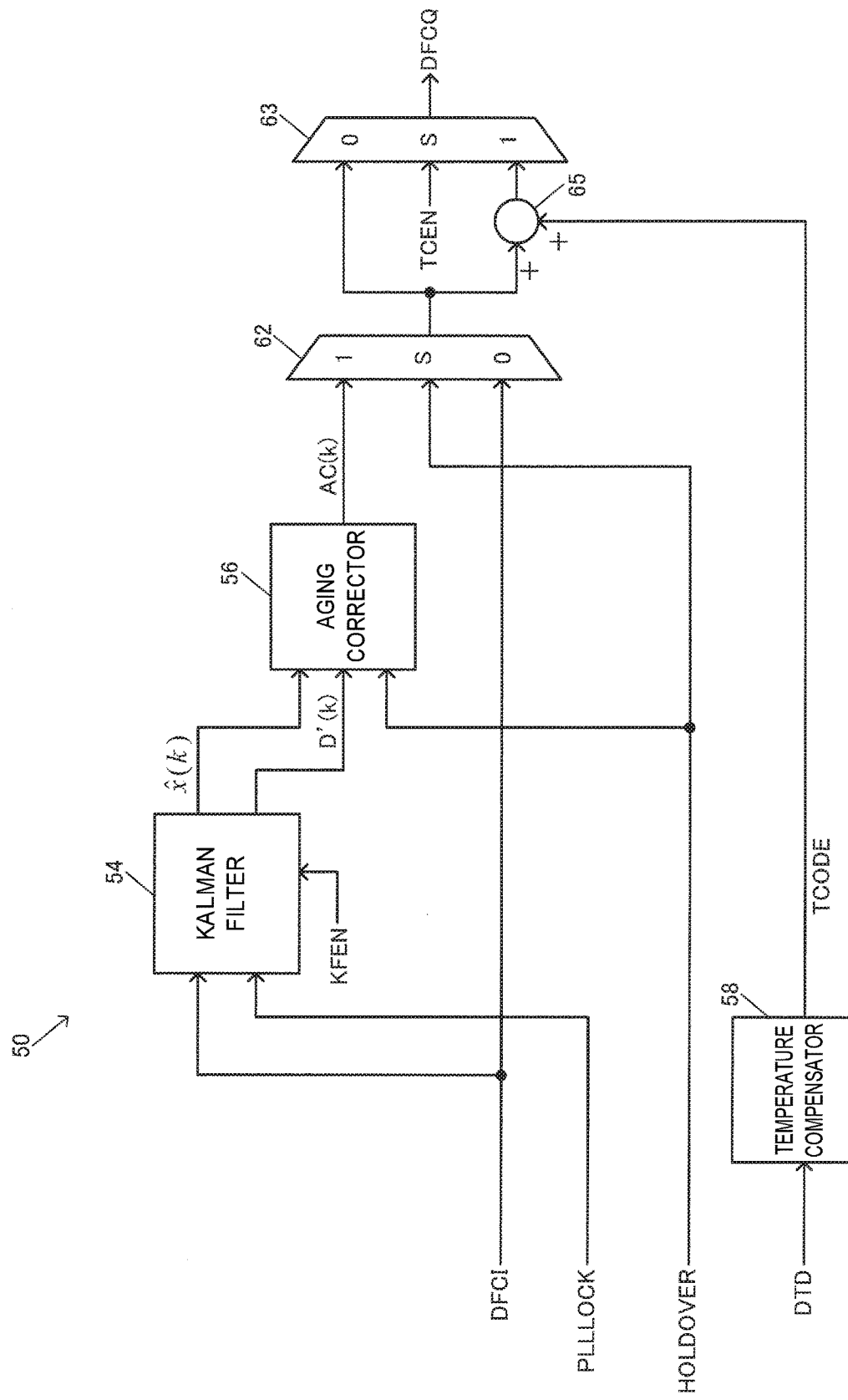
FIG. 12 is a diagram illustrating a detailed configuration example of a processor.

FIG. 12 illustrates a detailed configuration example of the processor 50. A configuration of the processor 50 is not limited to the configuration illustrated in FIG. 12, and may be variously modified by omitting some constituent elements or adding other constituent elements thereto.

As illustrated in FIG. 12, the processor 50 includes the Kalman filter 54, the aging corrector 56, the temperature compensator 58, selectors 62 and 63, and an adder 65.

The Kalman filter 54 to which the frequency control data DFCI (frequency control data from which an environmental change component is removed) is input performs a Kalman filter process. The Kalman filter 54 outputs a post-estimated value x^(k) corresponding to a true value estimated through the Kalman filter process. In the present specification, the hat symbol "^" indicating an estimated value is arranged with two letters as appropriate.

The Kalman filter process is a process in which, assuming that noise (errors) is included in an observed value and a variable indicating a state of a system, an optimal state of the system is estimated by using observed values acquired from the past to the present. Specifically, a state is estimated by repeatedly performing observation update (observation process) and time update (prediction process). The observation update is the process of updating a Kalman gain, an estimated value, and an error covariance by using observed values and results of the time update. The time update is the process of predicting an estimated value and an error covariance at the next time point by using results of the observation update. In the present embodiment, a technique using a linear Kalman filter process is focused, but an extended Kalman filter process may be used. The Kalman filter process of the present embodiment will be described later in detail.

The post-estimated value x^(k) and the correction value D'(k) are input to the aging corrector 56 from the Kalman filter 54. The frequency control data AC(k) having undergone aging correction is generated by performing calculation process of adding the correction value D'(k) to the post-estimated value x^(k) corresponding to a true value of the frequency control data. Here, D'(k) is a correction value D(k) having undergone a filter process (a low-pass filter process). In other words, in a case where a correction value (a correction value having undergone a filter process) at a time step k (time point k) is indicated by D'(k), and frequency control data having undergone aging correction at the time step k is indicated by AC(k), the aging corrector 56 obtains frequency control data AC(k+1) having undergone aging correction at a time step k+1 (time point k+1) according to AC(k+1)=AC(k)+D'(k).

The temperature compensator 58 to which the temperature detection data DTD is input performs a temperature compensation process, and generates temperature compensation data TCODE (temperature compensation code) for maintaining an oscillation frequency to be constant with respect to a temperature change. The temperature detection data DTD is data obtained by the A/D converter 20 illustrated in FIG. 9 A/D-converting the temperature detection voltage VTD from the temperature sensor 10.

Figure 13:
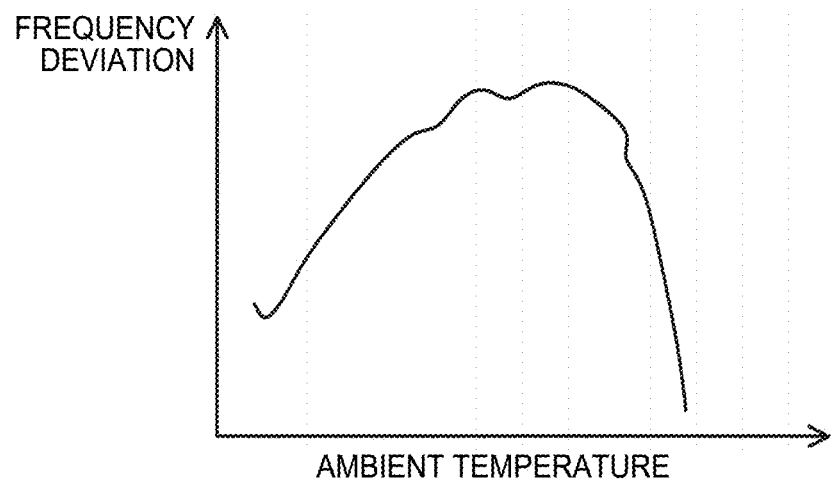
FIG. 13 is a diagram for explaining a temperature compensation process.
Figure 14:
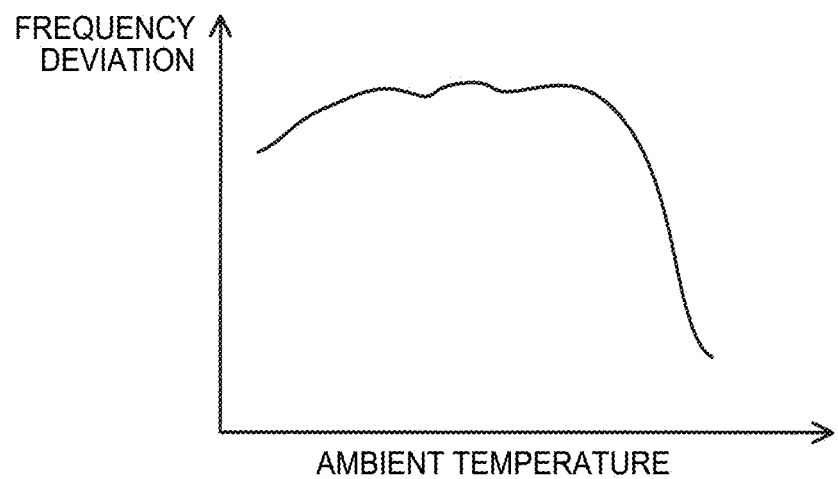
FIG. 14 is a diagram for explaining a temperature compensation process.
Figures 15, 16:
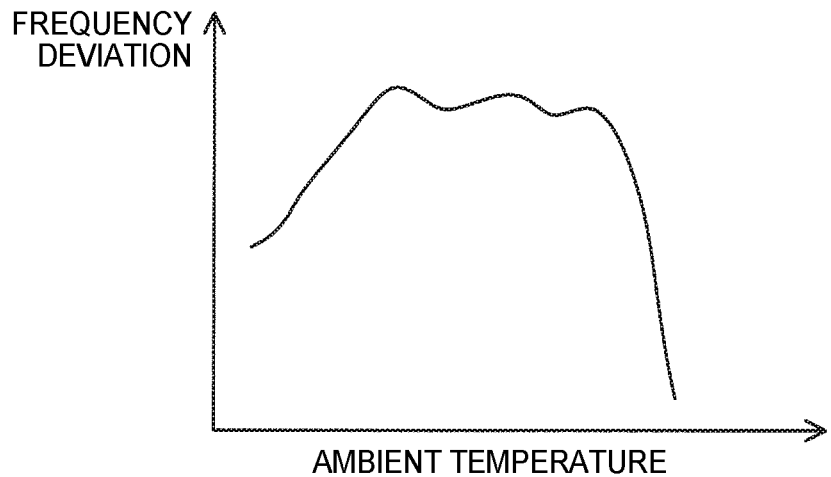
FIG. 15 is a diagram for explaining a temperature compensation process.
FIG. 16 is a diagram illustrating an operation of the processor.

For example, FIGS. 13, 14 and 15 illustrate examples of initial oscillation frequency-temperature characteristics. In the figures, a transverse axis expresses an ambient temperature, and a longitudinal axis expresses a frequency deviation of an oscillation frequency. As illustrated in FIGS. 13 to 15, the temperature characteristic of an oscillation frequency greatly varies for each product sample. Thus, in inspection steps of manufacturing and shipment of a product (oscillator), the temperature characteristic of an oscillation frequency or the change characteristic of temperature detection data corresponding to the ambient temperature is measured. Coefficients $A_0$ to $A_5$ of a polynomial (approximate function) in the following Equation (5) are obtained on the basis of measurement results, and information regarding the obtained coefficients $A_0$ to $A_5$ is written and stored in the storage 34 (nonvolatile memory) illustrated in FIG. 9.

$$TCODE = A_5 \cdot X^5 + A_4 \cdot X^4 + A_3 \cdot X^3 + A_2 \cdot X^2 + A_1 \cdot X + A_0 \quad (5)$$

In the above Equation (5), X corresponds to the temperature detection data DTD (A/D conversion value) obtained by the A/D converter 20. Since a change in the temperature detection data DTD with respect to a change in the ambient temperature is also measured, the ambient temperature and an oscillation frequency can be correlated with each other by using the approximate function shown in the polynominal in the above Equation (5). The temperature compensator 58 reads the information regarding the coefficients $A_0$ to $A_5$ from the storage 34, and performs a calculation process using the Equation (5) on the basis of the coefficients $A_0$ to $A_5$ and the temperature detection data DTD (=X), so as to generate the temperature compensation data TCODE (temperature compensation code). Consequently, it is possible to realize a temperature compensation process for maintaining an oscillation frequency to be constant with respect to a change in the ambient temperature.

Each of the selectors 62 and 63 selects an input signal which is input to a terminal "1" in a case where a logic level of an input signal which is input to a select terminal S is "1" (active), and outputs the selected input signal as an output signal. Each of the selectors 62 and 63 selects an input signal which is input to a terminal "0" in a case where a logic level of an input signal which is input to a select terminal S is "0" (inactive), and outputs the selected input signal as an output signal.

A signal KFEN is an enable signal of a Kalman filter process. The Kalman filter 54 performs a Kalman filter process in a case where the signal KFEN has a logic level of "1" (hereinafter, simply referred to as "1"). The signal PLLLOCK has "1" in a case where the PLL circuit is in a lock state. The signal HOLDOVER has "1" in a hold-over period in which a hold-over state is detected. The signals PLLLOCK and HOLDOVER are generated by a circuit related to a state machine of the hold-over processor 52 illustrated in FIG. 9.

A signal TCEN is an enable signal of a temperature compensation process. As an example, a description will be made focusing on a case where the signal TCEN has "1", and the selector 63 selects an input signal which is input to the terminal "1". The signal KFEN is assumed to also have "1".

In a normal operation period, the signal HOLDOVER has a logic level of "0" (hereinafter, simply referred to as "0"), and thus the selector 62 selects the frequency control data DFCI on the terminal "0" side. The temperature compensation data TCODE is added to the frequency control data DFCI by the adder 65, and the frequency control data DFCQ having undergone a temperature compensation process is output to the oscillation signal generation circuit 140 in the subsequent stage.

On the other hand, in a hold-over period, the signal HOLDOVER has "1", and thus the selector 62 selects AC(k) on the terminal "1" side. AC(k) indicates frequency control data having undergone aging correction.

FIG. 16 is a truth value table for explaining an operation of the Kalman filter 54. In a case where both of the signals PLLLOCK and KFEN have "1", the Kalman filter 54 performs a true value estimation process (Kalman filter process). In other words, in a case where the PLL circuit (internal or external PLL circuit) is in a lock state, a true value estimation process of the frequency control data DFCI which is an observed value is continuously performed.

In a case where a hold-over state occurs, thus the PLL circuit is unlocked, and thus the signal PLLLOCK has "0", the Kalman filter 54 holds the previous output state. For example, in FIG. 12, the post-estimated value x^(k) estimated as a true value of the frequency control data DFCI, or a value at a detection timing (a timing at which unlocking of the PLL circuit occurs) of the hold-over state as the correction value D'(k) for aging correction is held, and is continuously output.

The aging corrector 56 performs aging correction by using the post-estimated value x^(k) and the correction value D'(k) from the Kalman filter 54 in the hold-over period. Specifically, the post-estimated value x^(k) and the correction value D'(k) at the detection timing of the hold-over state are held, and the aging correction is performed.

In FIG. 12, of a temperature change component (in a broad sense, an environmental change component) and an aging change component, the frequency control data DFCI from which the temperature change component is removed is input to the Kalman filter 54. The Kalman filter 54 performs a Kalman filter process on the frequency control data DFCI from which the temperature change component (environmental change component) is removed, and thus a true value of the frequency control data DFCI is estimated. In other words, the post-estimated value x^(k) is obtained.

The aging corrector 56 performs aging correction on the basis of the post-estimated value x^(k) which is the estimated true value. More specifically, the frequency control data AC(k) having undergone the aging correction is obtained on the basis of the post-estimated value x^(k) and the correction value D'(k) from the Kalman filter 54. The frequency control data AC(k) having undergone the aging correction is input to the adder 65 via the selector 62, and the adder 65 performs a process of adding the temperature compensation data TCODE (data for compensating for the environmental change component) to the frequency control data AC(k).

Figure 17:
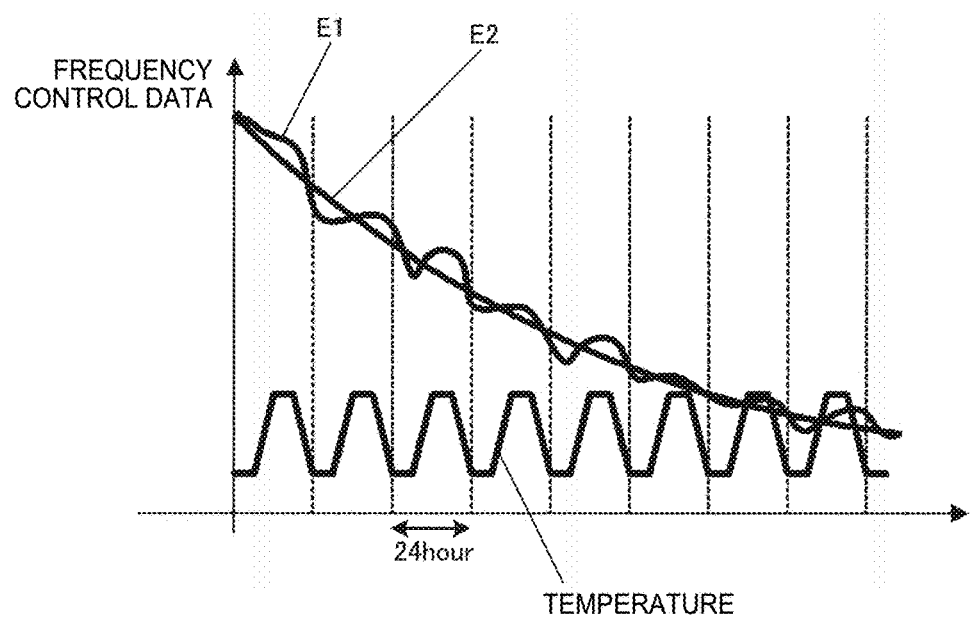
FIG. 17 is a diagram illustrating an operation of the processor.

For example, as illustrated in a schematic diagram of FIG. 17, if a temperature changes, frequency control data also changes according thereto as indicated by E1. Therefore, if a Kalman filter process is performed by using the frequency control data which changes according to a temperature change as indicated by E1, a true value at a hold-over detection timing also fluctuates.

Therefore, in the present embodiment, frequency control data from which the temperature change component is removed is acquired, and is input to the Kalman filter 54. In other words, of the temperature change component (environmental change component) and the aging change component, the frequency control data from which the temperature change component is removed is input to the Kalman filter 54. In other words, frequency control data as indicated by E2 in FIG. 17 is input. The frequency control data indicated by E2 is obtained by removing the temperature change component, and is thus frequency control data in which the aging change component remains.

The Kalman filter 54 performs a Kalman filter process on the frequency control data DFCI from which the temperature change component is removed and in which the aging change component remains as mentioned above, so as to obtain the post-estimated value x^(k) estimated as a true value or the correction value D'(k) for aging correction. The post-estimated value x^(k) which is a true value at the hold-over detection timing, or the correction value D'(k) is held in the aging corrector 56, and aging correction is performed.

For example, the adder 65 performs a process of adding the temperature compensation data TCODE to the frequency control data DFCQ, and thus the frequency control data DFCQ becomes temperature-compensated frequency control data. Therefore, the oscillation signal generation circuit 140 to which the frequency control data DFCQ is input outputs the oscillation signal OSCK having a temperature-compensated oscillation frequency. Therefore, the frequency control data generator 40 illustrated in FIG. 9 forming the PLL circuit along with the oscillation signal generation circuit 140 supplies the frequency control data DFCI from which the temperature change component is removed as indicated by E2 in FIG. 17, to the processor 50. The aging change component which changes over time remains in the frequency control data DFCI from which the temperature change component is removed as indicated by E2 in FIG. 17. Therefore, if the Kalman filter 54 of the processor 50 performs a Kalman filter process on the frequency control data DFCI in which the aging change component remains, and the aging corrector 56 performs aging correction on the basis of a result of the Kalman filter process, it is possible to realize highly accurate aging correction.

As a modification example of the configuration illustrated in FIG. 12, a calculation process for removing the temperature change component (environmental change component) of the frequency control data DFCI may be performed without performing a process of adding the temperature compensation data TCODE in the adder 65, and the frequency control data DFCI having undergone the calculation process may be input to the Kalman filter 54. For example, the configuration of the adder 65 and the selector 63 in FIG. 12 is omitted, a subtractor which subtracts the temperature compensation data TCODE from the frequency control data DFCI is provided in the previous stage of the Kalman filter 54, and an output from the subtractor is input to the Kalman filter 54. An adder which adds an output from the aging corrector 56 to the temperature compensation data TCODE is provided between the aging corrector 56 and the selector 62, and an output from the adder is input to the terminal "1" of the selector 62. Also with this configuration, the frequency control data DFCI from which the temperature change component can be removed and in which only the aging change component remains can be input to the Kalman filter 54.

Figure 18:
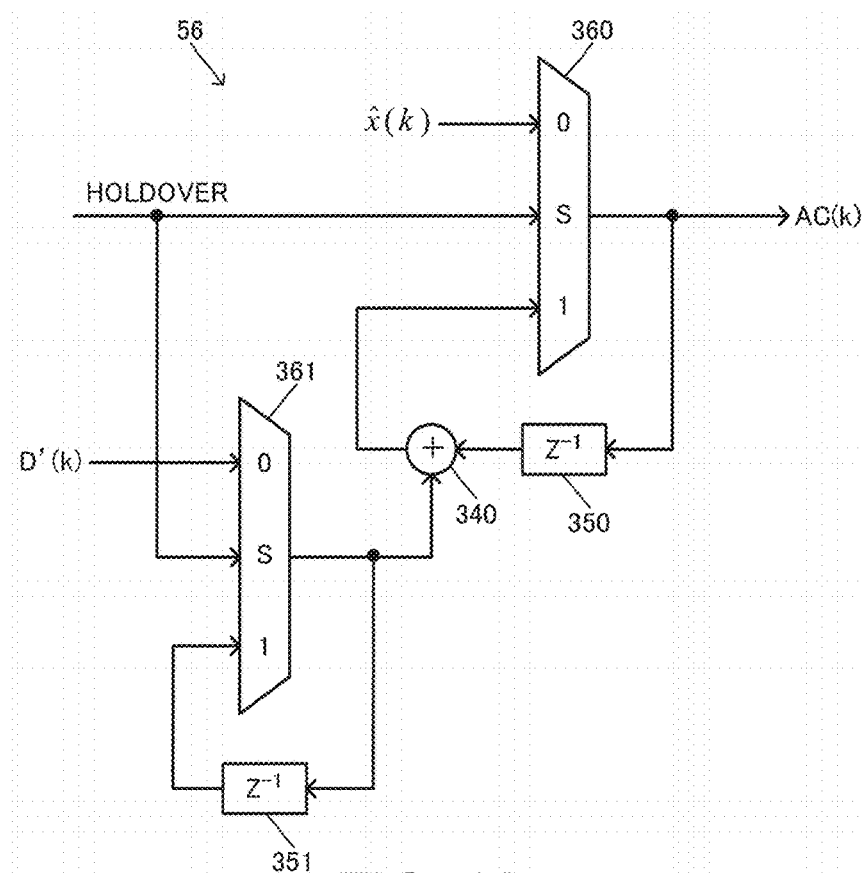
FIG. 18 is a diagram illustrating a configuration example of an aging corrector.

FIG. 18 illustrates a detailed configuration example of the aging corrector 56. In a normal operation period, since the signal HOLDOVER has "0", selectors 360 and 361 select terminal "0" sides. Consequently, in the normal operation period, the post-estimated value x^(k) and the correction value D'(k) (a correction value having undergone a filter process) calculated by the Kalman filter 54 are respectively held in registers 350 and 351.

If a hold-over state is detected, and the signal HOLDOVER has "1", the selectors 360 and 361 select terminal "1" sides. Consequently, the selector 361 continuously outputs the correction value D'(k) held in the register 351 at the hold-over detection timing during a hold-over period.

An adder 340 performs a process of sequentially adding the correction value D'(k) (correction value) which is held in the register 351 and is output from the selector 361, to the post-estimated value x^(k) held in the register 350 at the hold-over detection timing, for each time step. Consequently, aging correction as expressed by the following Equation (6) is realized.

$$AC(k+1)=AC(k)+D'(k) \tag{6}$$

In other words, the aging correction is realized by sequentially adding the correction value D'(k) for canceling (compensating for) a frequency change at an aging rate corresponding to the inclination indicated by C3, to the post-estimated value x^(k) which is a true value held in the timing C2 in FIG. 10.

7. Kalman Filter Process

Figure 19:
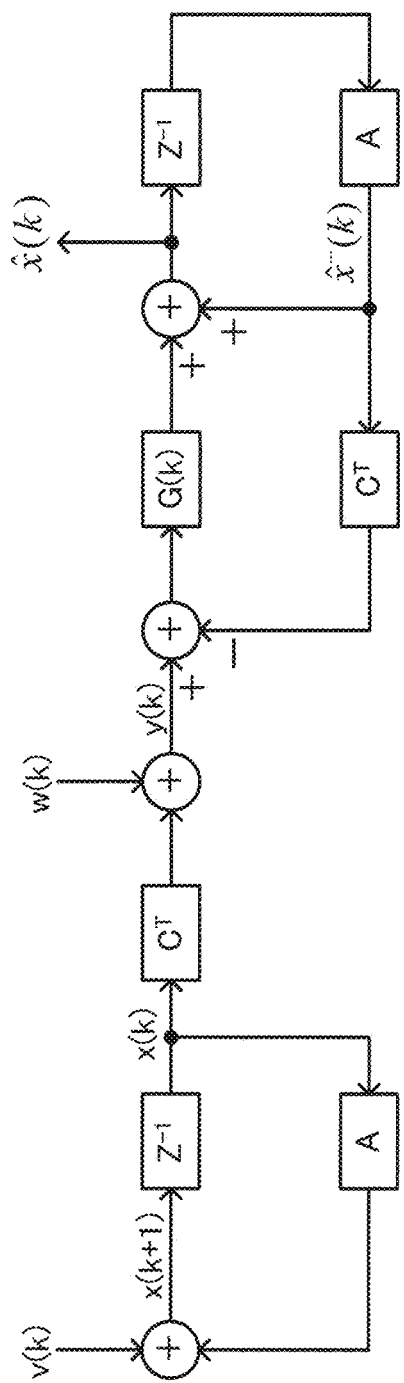
FIG. 19 is a diagram illustrating an example of a model of a Kalman filter.

Next, the Kalman filter process of the present embodiment will be described in detail. FIG. 19 illustrates an example of a Kalman filter model. A state equation and an observation equation of the Kalman filter model in FIG. 19 are expressed as in the following Equations (7) and (8).

$$x(k+1)=A \cdot x(k)+v(k) \tag{7}$$

$$y(k)=C^T x(k)+w(k) \tag{8}$$

Here, k indicates a time step which is a discrete time. In addition, x(k) indicates a state of a system at a time step k (time point k), and is, for example, an n-dimensional vector. A is called a system matrix. Specifically, A is a matrix of n×n, and correlates a state of the system at the time step k with a state of the system at a time step k+1 in a case where there is no system noise. Further, v(k) indicates system noise. Furthermore, y(k) indicates an observed value, and w(k) indicates observed noise. C indicates an observation coefficient vector (n dimensions), and T indicates a transposed matrix.

In a Kalman filter process on the model expressed by the above Equations (7) and (8), a process using the following Equations (9) to (13) is performed so that a true value is estimated.

$$\hat{x}^-(k) = A\hat{x}(k-1) \tag{9}$$

$$P^-(k) = A \cdot P(k-1) \cdot A^T + v(k) \tag{10}$$

$$G(k) = \frac{P^-(k) \cdot C}{C^T \cdot P^-(k) \cdot C + w(k)} \tag{11}$$

$$\hat{x}(k) = \hat{x}^-(k) + G(k) \cdot (y(k) - C^T \cdot \hat{x}^-(k)) \tag{12}$$

$$P(k) = (1 - G(k) \cdot C^T) \cdot P^-(k) \tag{13}$$

$\hat{x}(k)$: post-estimated value
$\hat{x}^-(k)$: pre-estimated value
$P(k)$: post-covariance
$P^-(k)$: pre-covariance
$G(k)$: Karman gain The above Equations (9) and (10) are equations regarding the time update (prediction process), and the above Equations (11) to (13) are equations regarding the observation update (observation process). Whenever the single time step k as a discrete time progresses, each of the time update (Equations (9) and (10)) and the observation update (Equations (11) to (13)) of the Kalman filter process is performed once.

Here, x^(k) and x^(k−1) are post-estimated values of a Kalman filter process at time steps k and k−1. In addition, x^−k) is a pre-estimated value predicted before an observed value is obtained. P(k) is a post-covariance in the Kalman filter process, and P⁻(k) is a pre-covariance predicted before an observed value is obtained. G(k) is a Kalman gain.

In the Kalman filter process, the Kalman gain G(k) is obtained according to the above Equation (11) during the observation update. The post-estimated value x^(k) is updated according to the above Equation (12) on the basis of the observed value y(k). The post-covariance P(k) of errors is updated according to the above Equation (13).

In the Kalman filter, during the time update, as shown in the above Equation (9), the pre-estimated value x^⁻(k) at the next time step k is predicted on the basis of the post-estimated value x^(k−1) at the time step k−1 and the system matrix A. As shown in the above Equation (10), the pre-covariance P⁻(k) at the next time step k is predicted on the basis of the post-covariance P(k−1) at the time step k−1, the system matrix A, and the system noise v(k).

Meanwhile, if a Kalman filter process using the above Equations (9) to (13) is to be performed, a processing load on the processor 50 is excessive, and thus a size of the circuit device may increase. For example, in order to obtain A of x^⁻(k)=Ax^(k−1) in the above Equation (9), an extended Kalman filter process is required to be performed. The extended Kalman filter process requires a considerable processing load, and if the processor 50 is implemented by hardware being capable of performing the extended Kalman filter process, a circuit area of the processor 50 tends to increase. Thus, this is not appropriate in a situation in which the circuit device built into an oscillator is strongly required to be small-sized. On the other hand, if fixed scalar values are used as the system matrix A, it is difficult to realize appropriate aging correction.

Therefore, in order to solve this problem, in the present embodiment, the Kalman filter process is performed according to the following Equations (14) to (19) instead of the above Equations (9) to (13). In other words, the processor 50 (Kalman filter 54) performs a Kalman filter process based on the following Equations (14) to (19).

$$\hat{x}^-(k) = \hat{x}(k-1) + D(k-1) \quad (14)$$

$$P^-(k) = P(k-1) + v(k) \quad (15)$$

$$G(k) = \frac{P^-(k)}{P^-(k) + w(k)} \quad (16)$$

$$\hat{x}(k) = \hat{x}^-(k) + G(k) \cdot (y(k) - \hat{x}^-(k)) \quad (17)$$

$$P(k) = (1 - G(k)) \cdot P^-(k) \quad (18)$$

$$D(k) = D(k-1) + E \cdot (y(k) - \hat{x}^-(k)) \quad (19)$$

In the present embodiment, since x(k) as a true value estimation processing target is frequency control data, and the observed value y(k) is also frequency control data, C becomes 1. A scalar value of A is infinitely near 1, and thus the above Equation (15) may be used instead of the above Equation (10).

As described above, compared with a case of using an extended Kalman filter process as the Kalman filter process, in the Kalman filter process of the present embodiment, as shown in the above Equation (14), the pre-estimated value x^−(k) at the time step k is obtained by adding the post-estimated value x^(k−1) and the correction value D(k−1) at the time step k−1 together. Thus, it is not necessary to use the extended Kalman filter process, and thus the Kalman filter process of the present embodiment is excellent in that it is possible to reduce a processing load on the processor 50 or to suppress an increase in a circuit size.

In the present embodiment, the above Equation (14) is derived through modifications as follows.

$$\hat{x}^-(k) = A\hat{x}(k-1) \quad (20)$$

$$= \hat{x}(k-1) + (A-1) \cdot \hat{x}(k-1) \quad (21)$$

$$\approx \hat{x}(k-1) + (A-1) \cdot F_0 \quad (22)$$

$$= \hat{x}(k-1) + D(k-1) \quad (23)$$

For example, the above Equation (20) may be modified into the above Equation (21). Here, (A−1) in the above Equation (21) is a considerably small number, and thus (A−1)·x^(k−1) can be replaced with (A−1)·$F_0$ so as to be approximated as shown in the above Equations (22) and (23). (A−1)·$F_0$ is set to the correction value D(k−1).

As shown in the above Equation (19), during the time update from the time step k−1 to the time step k, a process of updating the correction value D(k)=D(k−1)+E·(y(k)−x^−(k))=D(k−1)+E·ek is performed. Here, ek=y(k)−x^−(k) is called an observation residual in the Kalman filter process. In addition, E is a constant. A modification may occur so that the Kalman gain G(k) is used instead of the constant E. In other words, D(k)=D(k−1)+G(k)·ek may be used.

As mentioned above, in Equation (19), the correction value D(k) is obtained according to D(k)=D(k−1)+E·ek by using the observation residual ek and the constant E. In the above-described way, it is possible to perform a process of updating the correction value D(k) in which the observation residual ek is reflected in the Kalman filter process.

Figure 20:
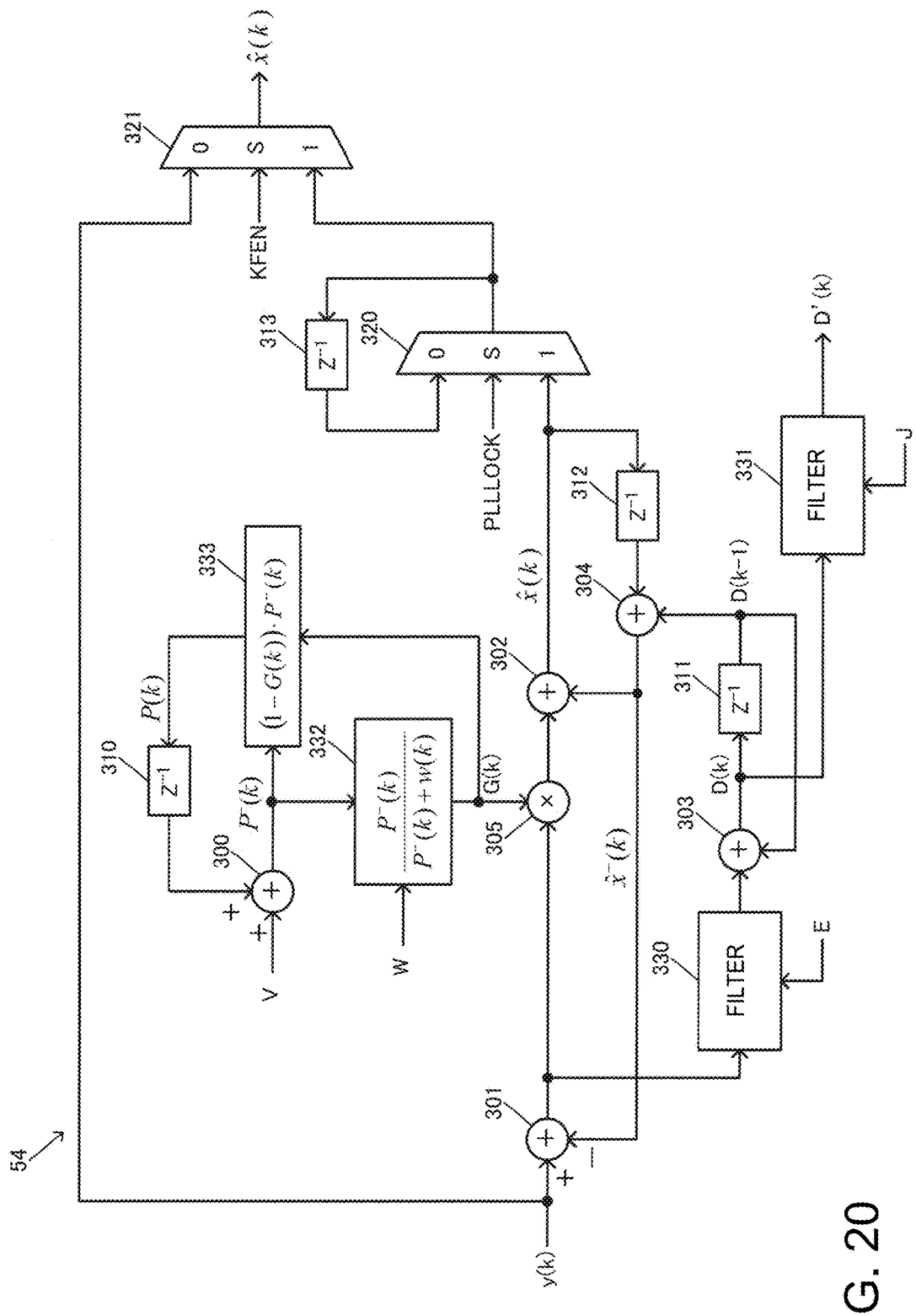
FIG. 20 is a diagram illustrating a configuration example of a Kalman filter.

FIG. 20 illustrates a configuration example of the Kalman filter 54. The Kalman filter 54 includes adders 300, 301, 302, 303 and 304, a multiplier 305, registers 310, 311, 312 and 313, selectors 320 and 321, filters 330 and 331, and calculators 332 and 333. A configuration of the Kalman filter 54 is not limited to the configuration illustrated in FIG. 20, and may be variously modified by omitting some constituent elements or adding other constituent elements thereto. For example, processes in the adders 300 to 304 or the like may be performed in a time division manner by using a single calculator.

The calculation process in the above Equation (14) is performed by the adder 304 and the register 312. Information regarding the system noise constant V for setting system noise and the observation noise constant W for setting observation noise is read from the storage 34 illustrated in FIG. 9, and is input to the Kalman filter 54 (processor 50). The calculation process in the above Equation (15) is performed by the adder 300 and the register 310. The calculator 332 performs the calculation process in the above Equation (16) so as to obtain the Kalman gain G(k). The calculation process in the above Equation (17) is performed by the adder 301, the multiplier 305, and the adder 302 on the basis of the obtained Kalman gain G(k). The calculator 333 performs the calculation process in the above Equation (18) so as to obtain the post-covariance P(k).

The calculation process in the above Equation (19) is performed by the adder 303, the register 311, and the filter 330. Information regarding the constant E which will be input to the filter 330 is read from the storage 34 illustrated in FIG. 9. The constant E corresponds to a correction coefficient (filter constant) for an aging rate. For example, the filter 330 adjusts a gain on the basis of the constant E so as to implement E·(y(k)−x^−(k)) in Equation (19).

The selectors 320 and 321 select an input signal which is input to a terminal is "1" in a case where the signals PLLLOCK and KFEN have "1". An output signal from the selector 320 is held in the register 313. Therefore, if a hold-over state occurs, and the signal PLLLOCK changes from "1" to "0", the true value x^(k) at a hold-over detection timing is held in the register 313.

The filter 331 performs a filter process on the correction value D(k). Specifically, a digital low-pass filter is performed on the correction value D(k), and a correction value D'(k) having undergone the filter process is input to the aging corrector 56 illustrated in FIG. 18. A constant J is a filter constant of the filter 331. An optimal cutoff frequency of the filter 331 is set on the basis of the constant J.

For example, there is a fine change fluctuation in the correction value D(k) for compensating for a frequency change at an aging rate as is clear from FIG. 10. Therefore, if the correction value D(k) having the fluctuation is added to a true value, the accuracy of aging correction is reduced.

In relation to this fact, in the present embodiment, the correction value D'(k) having undergone the filter process is added to a true value, and thus it is possible to realize more highly accurate aging correction.

As described above, in the present embodiment, as shown in the above Equation (14), the processor 50 performs a process of obtaining the pre-estimated value x^−(k) at the present timing by adding the post-estimated value x^(k−1) and the correction value D(k−1) at the previous timing together, in a process of updating (time update) a pre-estimated value during the Kalman filter process. The aging correction is performed on the frequency control data on the basis of results of the Kalman filter process. In other words, the post-estimated value x^(k−1) and the correction value D(k−1) at the time step k−1 which is the previous timing are added together, and thus the pre-estimated value x^−(k) at the time step k which is the present timing is obtained according to x^−(k)=x^(k−1)+D(k−1).

The processor 50 (aging corrector 56) performs the aging correction on the basis of results (the true value and the correction value) of the Kalman filter process. In other words, in a case where a correction value at the time step k is indicated by D(k) (or D'(k)), and frequency control data having undergone aging correction at the time step k is indicated by AC(k), frequency control data AC(k+1) having undergone aging correction at the time step k+1 is obtained according to AC(k+1)=AC(k)+D(k) (or AC(k)+D'(k)).

As shown in the above Equation (19), the processor 50 obtains the correction value D(k) at the present timing by using the correction value D(k−1) at the previous timing and the observation residual ek in the Kalman filter process. For example, E·ek (or G(k)·ek) based on the observation residual is added to the correction value D(k−1) at the previous timing, and thus the correction value D(k) at the present timing is obtained. Specifically, the correction value D(k) at the time step k which is the present timing is obtained by using the correction value D(k−1) at the time step k−1 which is the previous timing and the observation residual ek in the Kalman filter process. For example, the correction value D(k) is obtained according to D(k)=D(k−1)+E·ek by using the observation residual ek and the constant E.

For example, in the present embodiment, as described with reference to FIG. 17, environmental change component information such as temperature change component information is acquired, and frequency control data from which the environmental change component is removed of the environmental change component and the aging change component is acquired by using the acquired environmental change component information. Here, the environmental change component information may be, for example, a power supply voltage change component, an atmospheric pressure change component, or a gravity change component. Aging correction is performed on the basis of the frequency control data from which the environmental change component is removed. Specifically, it is assumed that the environmental change component is a temperature. In this case, the temperature change component information which is environmental change component information is acquired on the basis of the temperature detection data DTD which is obtained by using a temperature detection voltage VTD from the temperature sensor 10 illustrated in FIG. 9 as an environmental change information acquirer which acquires environmental change component information. Frequency control data from which the temperature change component is removed is acquired by using the acquired temperature change component information. For example, the temperature compensation data TCODE is acquired by the temperature compensator 58 illustrated in FIG. 12, so as to be added by the adder 65, and thus the frequency control data DFCI from which the temperature change component is removed is input from the frequency control data generator 40 so as to be acquired by the processor 50. In other words, as indicated by E2 in FIG. 17, the frequency control data DFCI from which the temperature change component is removed and in which the aging change component remains is acquired, and is input to the Kalman filter 54.

The frequency control data from which the environmental change component is removed includes not only frequency control data in a preferable state in which the environmental change component is completely removed therefrom but also frequency control data in a state in which the environmental change component with a negligible level is included in the frequency control data.

For example, environmental change component information such as temperature change component information or power supply voltage change information may be acquired by a temperature sensor, a voltage detection circuit, or the like as an environmental change information acquirer detecting environmental change component information. On the other hand, the aging change component is a change component of an oscillation frequency which changes over time, and it is difficult to directly obtain information regarding the aging change component by using a sensor or the like.

Therefore, in the present embodiment, environmental change component information such as temperature change component information which can be detected by a sensor or the like is acquired, and frequency control data from which the environmental change component is removed of the environmental change component and the aging change component is acquired by using the environmental change component information. In other words, a process (for example, an addition process in the adder 65) of removing the environmental change component from the change components of frequency control data is performed, and thus frequency control data in which only the aging change component remains can be acquired as indicated by E2 in FIG. 17. If a Kalman filter process or the like is performed on the basis of the frequency control data in which the aging change component remains, a true value of the frequency control data can be estimated. If aging correction is performed on the basis of the true value estimated in the above-described way, it is possible to realize highly accurate aging correction which cannot be realized in examples of the related art.

As mentioned above, in the present embodiment, the frequency control data DFCI from which the temperature change component (environmental change component) is removed and in which the aging change component remains is input to the Kalman filter 54. As illustrated in FIGS. 1 and 10, if a period is restricted, it may be expected that an oscillation frequency changes at a constant aging rate in the period. For example, it may be expected that an oscillation frequency changes with a constant inclination as indicated by C3 in FIG. 10.

In the present embodiment, a correction value for compensating for (canceling) the frequency change at the constant aging rate due to the aging change component is obtained according to D(k)=D(k−1)+E·ek. In other words, the correction value D(k) for compensating for the frequency change at an aging rate corresponding to the inclination indicated by C3 in FIG. 10 is obtained. Here, the aging rate is not constant, and changes over time as illustrated in FIGS. 1 and 10.

In relation to this fact, in the present embodiment, a process of updating the correction value D(k) corresponding to an aging rate is performed on the basis of the observation residual ek=y(k)−x^−(k) in the Kalman filter process, such as D(k)=D(k−1)+E·ek. Therefore, it is possible to realize an update process on the correction value D(k) in which a change in an aging rate according to the elapsed time is also reflected. Therefore, it is possible to realize more highly accurate aging correction.

Figure 21:
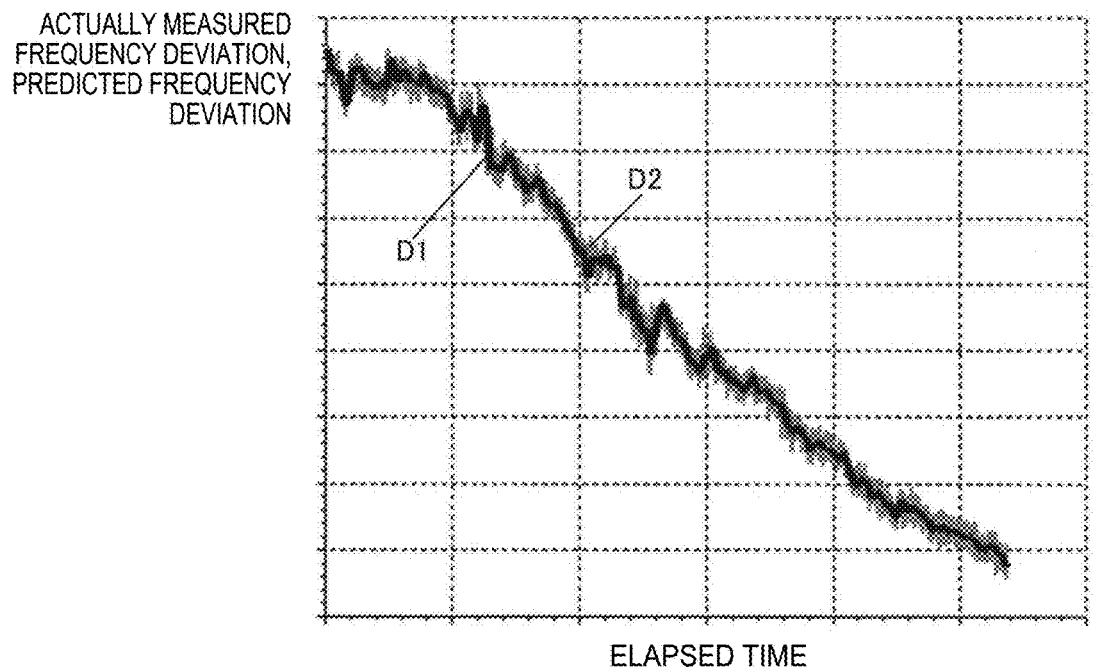
FIG. 21 is a diagram illustrating an example of a predicted frequency deviation and an actually measured frequency deviation according to an embodiment of the invention.

For example, FIG. 21 illustrates an actually measured frequency deviation and a predicted frequency deviation in a comparison manner. D1 indicates an actually measured frequency deviation of an oscillation frequency, and D2 indicates a frequency deviation of an oscillation frequency which is predicted through the estimation process using the Kalman filter of the present embodiment. The predicted frequency deviation indicated by D2 is included in an allowable error range with respect to the actually measured frequency deviation indicated by D1, and thus this shows that highly accurate aging correction is realized according to the present embodiment.

8. Temperature Sensor and Oscillation Circuit

Figure 22:
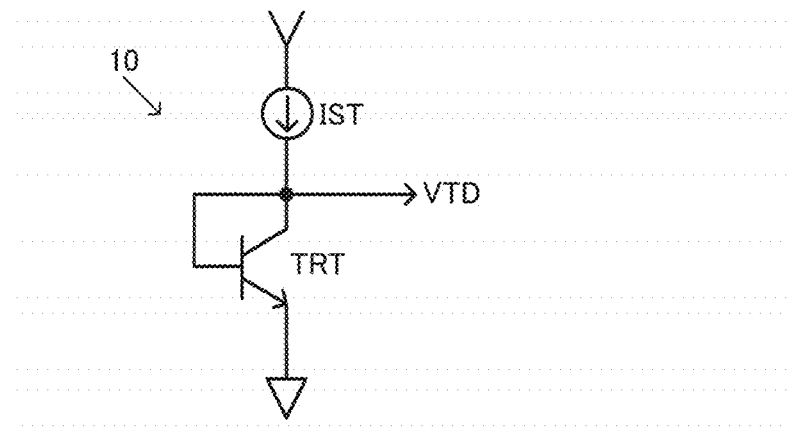
FIG. 22 is a diagram illustrating a configuration example of a temperature sensor.

FIG. 22 illustrates a configuration example of the temperature sensor 10. The temperature sensor 10 illustrated in FIG. 22 includes a current source IST, and a bipolar transistor TRT having a collector to which a current from the current source IST is supplied. The bipolar transistor TRT has a diode connection in which the collector is connected to a base thereof, and thus the temperature detection voltage VTD having temperature characteristics is output to a node of the collector of the bipolar transistor TRT. The temperature characteristics of the temperature detection voltage VTD are caused by temperature dependency of a voltage between the base and an emitter of the bipolar transistor TRT. The temperature detection voltage VTD from the temperature sensor 10 has, for example, negative temperature characteristics (first-order temperature characteristics with a negative gradient).

Figure 23:
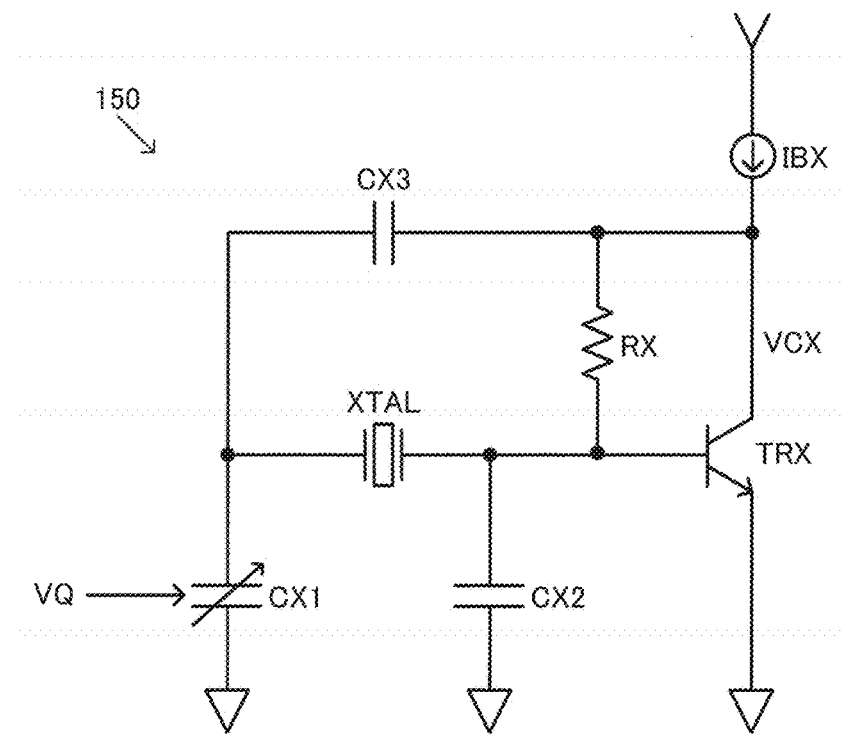
FIG. 23 is a diagram illustrating a configuration example of an oscillation circuit.

FIG. 23 illustrates a configuration example of the oscillation circuit 150. The oscillation circuit 150 includes a current source IBX, a bipolar transistor TRX, a resistor RX, a variable capacitance capacitor CX1, and capacitors CX2 and CX3.

The current source IBX supplies a bias current to a collector of the bipolar transistor TRX. The resistor RX is provided between the collector and a base of the bipolar transistor TRX.

One end of the variable capacitance capacitor CX1 whose capacitance is variable is connected to a resonator XTAL. Specifically, one end of the variable capacitance capacitor CX1 is connected to one end of the resonator XTAL via a first resonator terminal (resonator pad) of the circuit device. One end of the capacitor CX2 is connected to the other end of the resonator XTAL. Specifically, one end of the capacitor CX2 is connected to the other end of the resonator XTAL via a second resonator terminal (resonator pad) of the circuit device. One end of the capacitor CX3 is connected to one end of the resonator XTAL, and the other end thereof is connected to the collector of the bipolar transistor TRX.

A base-emitter current caused by oscillation of the resonator XTAL flows through the bipolar transistor TRX. If the base-emitter current increases, a current between the collector and the emitter of the bipolar transistor TRX increases, and thus a bias current which branches to the resistor RX from the current source IBX is reduced so that a collector voltage VCX is lowered. On the other hand, if a current between the base and the emitter of the bipolar transistor TRX is reduced, a collector-emitter current is reduced, and thus a bias current which branches to the resistor RX from the current source IBX increases so that the collector voltage VCX is heightened. The collector voltage VCX is fed back to the resonator XTAL via the capacitor CX3.

An oscillation frequency of the resonator XTAL has temperature characteristics, and the temperature characteristics are compensated by the output voltage VQ (frequency control voltage) from the D/A converter 80. In other words, the output voltage VQ is input to the variable capacitance capacitor CX1, and thus a capacitance value of the variable capacitance capacitor CX1 is controlled by the output voltage VQ. If the capacitance value of the variable capacitance capacitor CX1 changes, a resonance frequency of an oscillation loop changes, and thus a variation in an oscillation frequency due to the temperature characteristics of the resonator XTAL is compensated for. The variable capacitance capacitor CX1 is implemented by, for example, a variable capacitance diode (varactor).

A configuration of the oscillation circuit 150 of the present embodiment is not limited to the configuration illustrated in FIG. 23, and may be variously modified. For example, in FIG. 23, the capacitor CX1 is used as a variable capacitance capacitor, but the capacitors CX2 or CX3 may be used as a variable capacitance capacitor which is controlled by the output voltage VQ. Some of the plurality of capacitors CX1 to CX3 may be used as variable capacitance capacitors which are controlled by the output voltage VQ.

The oscillation circuit 150 may not include all circuit elements for causing the resonator XTAL to oscillate. For example, there may be a configuration in which some circuit elements are formed by using discrete components provided outside the circuit device 500, and are connected to the oscillation circuit 150 via external connection terminals.

9. Modification Examples

Figure 24:
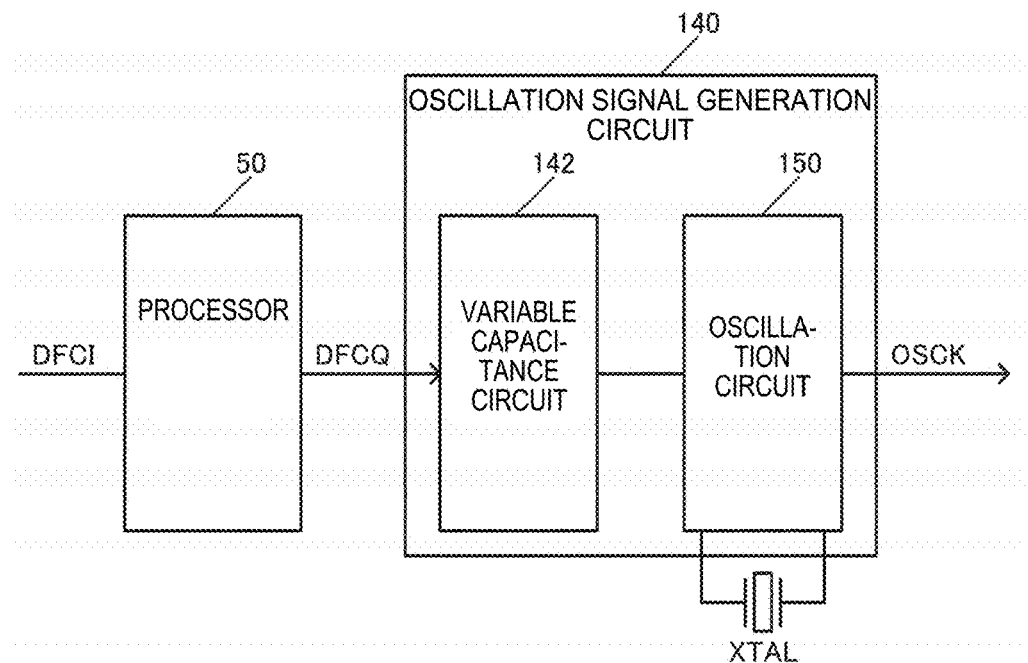
FIG. 24 is a diagram for explaining a modification example of the embodiment.

Next, various modification examples of the present embodiment will be described. FIG. 24 illustrates a configuration example of a circuit device according to a modification example of the present embodiment.

In FIG. 24, the D/A converter 80 is not provided in the oscillation signal generation circuit 140 unlike in FIGS. 2 and 9. An oscillation frequency of the oscillation signal OSCK generated by the oscillation signal generation circuit 140 is directly controlled on the basis of the frequency control data DFCQ from the processor 50. In other words, an oscillation frequency of the oscillation signal OSCK is controlled without using the D/A converter.

For example, in FIG. 24, the oscillation signal generation circuit 140 a variable capacitance circuit 142 and an oscillation circuit 150. The oscillation signal generation circuit 140 is not provided with the D/A converter 80 illustrated in FIGS. 2 and 9. The variable capacitance circuit 142 is provided instead of the variable capacitance capacitor CX1 illustrated in FIG. 23, and one end of the variable capacitance circuit 142 is connected to one end of the resonator XTAL.

A capacitance value of the variable capacitance circuit 142 is controlled on the basis of the frequency control data DFCQ from the processor 50. For example, the variable capacitance circuit 142 is provided with a plurality of capacitors (capacitor array), and a plurality of switch elements (switch array) each of which allows turning-on and turning-off to be controlled on the basis of the frequency control data DFCQ. Each of the plurality of switch elements is electrically connected to each of the plurality of capacitors. The plurality of switch elements are turned on or off, and thus the number of capacitors whose one ends are connected to one end of the resonator XTAL among the plurality of capacitors changes. Consequently, a capacitance value of the variable capacitance circuit 142 is controlled, and thus a capacitance value at one end of the resonator XTAL changes. Therefore, a capacitance value of the variable capacitance circuit 142 can be directly controlled by the frequency control data DFCQ, and thus an oscillation frequency of the oscillation signal OSCK can be controlled.

Figure 25:
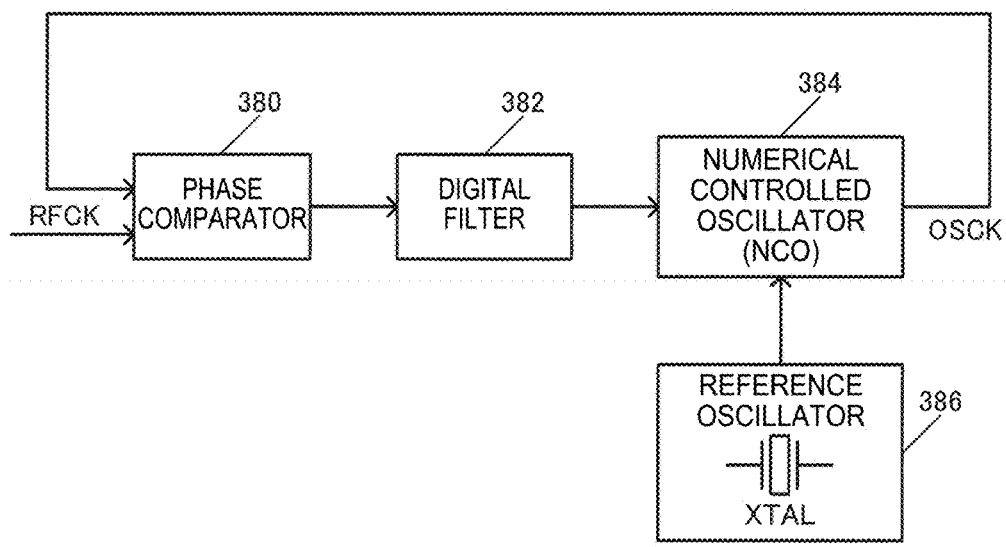
FIG. 25 is a diagram for explaining a modification example of the embodiment.

In a case where a PLL circuit is formed by using the circuit device of the present embodiment, the PLL circuit may be formed according to a direct digital synthesizer method. FIG. 25 illustrates a circuit configuration example in a case of the direct digital synthesizer method.

A phase comparator 380 (comparison calculator) performs phase comparison (comparison calculation) between the reference signal RFCK and the oscillation signal OSCK (an input signal based on the oscillation signal). A digital filter 382 performs a smoothing process on phase errors. A configuration and an operation of the phase comparator 380 are the same as those of the phase comparator 41 illustrated in FIG. 9, and may include a counter or a time digital converter (TDC). The digital filter 382 corresponds to the digital filter 44 illustrated in FIG. 9. A numerical controlled oscillator 384 is a circuit which digitally synthesizes any frequency or waveform by using a reference oscillation signal from a reference oscillator 386 having the resonator XTAL. In other words, instead of controlling an oscillation frequency on the basis of a control voltage from a D/A converter, such as a VCO, the oscillation signal OSCK having any oscillation frequency is generated through a digital calculation process by using digital frequency control data and the reference oscillator 386 (resonator XTAL). A direct digital synthesizer type ADPLL circuit can be implemented by using the configuration illustrated in FIG. 25.

In the above-described technique of the present embodiment, the Kalman filter process is performed on the aging change component obtained by removing the environmental change component from the change components of frequency control data, and thus a true value from which a variation is removed is estimated. A correction value (oscillation characteristic change coefficient) for aging correction is calculated, and aging correction is performed by using the true value and the correction value so that control for making an oscillation frequency constant is realized. However, a technique of the present embodiment is not limited to such a technique, and may be variously modified.

For example, in a technique of a first modification example of the present embodiment, a value of the aging change component obtained by removing the environmental change component from a measured value is preserved in a storage (memory). An oscillation frequency may be controlled on the basis of a plurality of stored values of the aging change component and a linear expression or an approximate expression of a multi-order polynomial which is prepared in advance.

In a technique of a second modification example of the present embodiment, in a case where a value of the aging change component obtained by removing the environmental change component from a measured value is equal to or greater than a predetermined value, another oscillator which is preliminarily prepared is used, and thus the influence of aging may be restricted to a predetermined range.

The circuit device of the present embodiment is applicable not only to a circuit device forming a loop of a PLL circuit but also to a circuit device for a self-running oscillator.

10. Oscillator, Electronic Apparatus, and Vehicle

Figure 26:
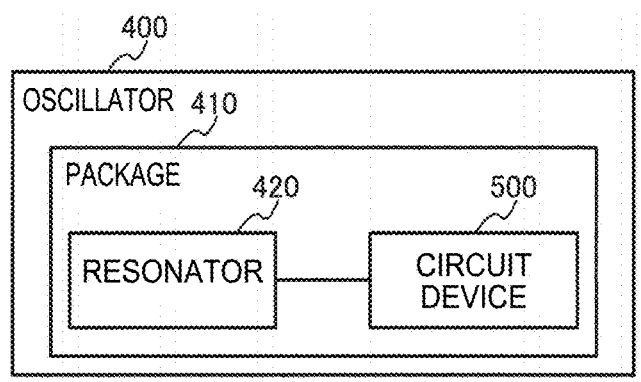
FIG. 26 is a diagram illustrating a configuration example of an oscillator.

FIG. 26 illustrates a configuration example of an oscillator 400 provided with the circuit device 500 of the present embodiment. As illustrated in FIG. 26, the oscillator 400 includes a resonator 420 and the circuit device 500. The resonator 420 and the circuit device 500 are mounted in a package 410 of the oscillator 400. A terminal of the resonator 420 is electrically connected to a terminal (pad) of the circuit device 500 (IC) via an internal wiring of the package 410.

Figure 27:
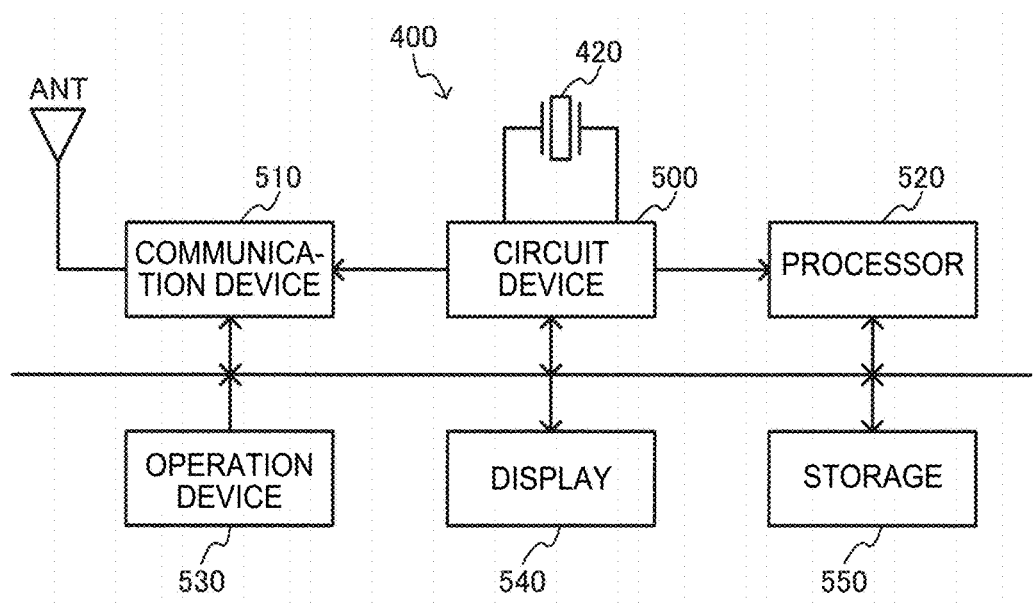
FIG. 27 is a diagram illustrating a configuration example of an electronic apparatus.

FIG. 27 illustrates a configuration example of an electronic apparatus including the circuit device 500 of the present embodiment. The electronic apparatus includes the circuit device 500 of the present embodiment, the resonator 420 such as a quartz crystal resonator, an antenna ANT, a communication device 510, a processor 520, and the like. The electronic apparatus may include an operation device 530, a display 540, and a storage 550. The oscillator 400 is formed of the resonator 420 and the circuit device 500. A configuration of the electronic apparatus is not limited to the configuration illustrated in FIG. 27, and may be variously modified by omitting some constituent elements or adding other constituent elements thereto.

As the electronic apparatus illustrated in FIG. 27, there may be various apparatuses, for example, a network related apparatus such as a base station or a router, a highly accurate measurement apparatus, a GPS built-in clock, a wearable apparatus such as a biological information measurement apparatus (a sphygmograph, a pedometer, or the like) or a head mounted display, a portable information terminal (mobile terminal) such as a smart phone, a mobile phone, a portable game apparatus, a notebook PC, or a tablet PC, a content providing terminal which delivers content, and a video apparatus such as a digital camera or a video camera.

The communication device 510 (wireless circuit) performs a process of receiving data from an external apparatus or transmitting data to the external apparatus, via the antenna ANT. The processor 520 performs a process of controlling the electronic apparatus, or various digital processes on data which is transmitted and received via the communication device 510. The function of the processor 520 may be realized by, for example, a processor such as a microcomputer.

The operation device 530 is used for a user to perform an input operation, and may be implemented by, for example, an operation button or a touch panel display. The display 540 displays various pieces of information, and may be implemented by, for example, a liquid crystal display or an organic EL display. In a case where a touch panel display is used as the operation device 530, the touch panel display also functions as the operation device 530 and the display 540. The storage 550 stores data, and a function thereof may be realized by a semiconductor memory such as a RAM or a ROM, or a hard disk drive (HDD).

Figure 28:
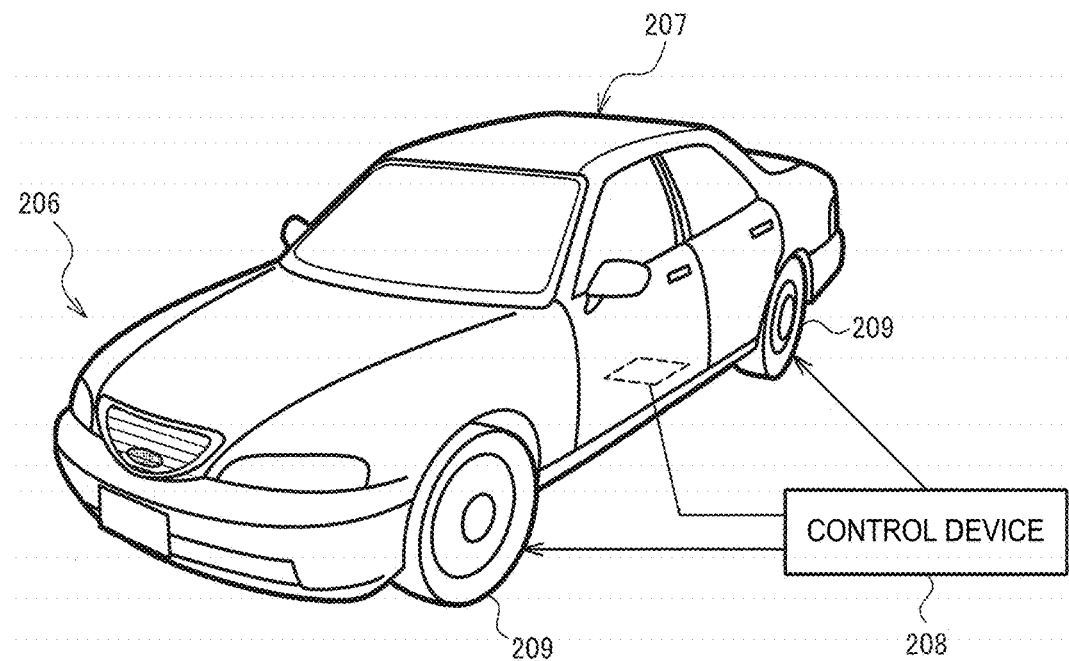
FIG. 28 is a diagram illustrating a configuration example of a vehicle.

FIG. 28 illustrates an example of a vehicle including the circuit device of the present embodiment. The circuit device (oscillator) of the present embodiment may be incorporated into, for example, various vehicles such as a car, an aircraft, a motorbike, a bicycle, and a ship. The vehicles are pieces of equipment or instruments which are provided with, for example, driving mechanisms such as engines or motors, steering mechanisms such as handles or rudders, and various electronic apparatuses (on-vehicle apparatuses), and move on the ground, in the air, and in the sea. FIG. 28 schematically illustrates an automobile 206 as a specific example of the vehicle. The oscillator (not illustrated) including the circuit device and the resonator of the present embodiment is incorporated into the automobile 206. A control device 208 operates on the basis of a clock signal generated by the oscillator. The control device 208 controls hardness and softness of a suspension or a brake of each car wheel 209, for example, in accordance with the attitude of a car body 207. For example, automatic driving of the automobile 206 may be realized by the control device 208. An apparatus into which the circuit device or the oscillator of the present embodiment is incorporated is not limited to the control device 208, and the circuit device or the oscillator of the present embodiment may be incorporated into various apparatuses (on-vehicle apparatuses) provided in a vehicle such as the automobile 206.

Figure 29:
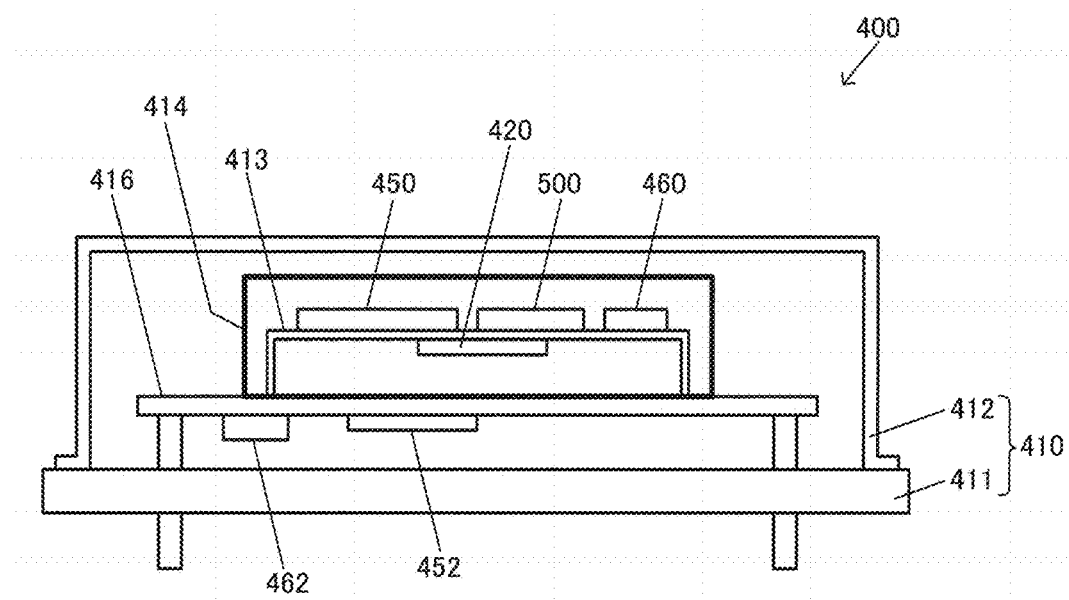
FIG. 29 is a diagram illustrating a detailed structure example of the oscillator.

FIG. 29 illustrates a detailed structure example of the oscillator 400. The oscillator 400 illustrated in FIG. 29 is an oscillator having a double oven structure (in a broad sense, an oven structure).

The package 410 is formed of a board 411 and a case 412. Various electronic components (not illustrated) are mounted on the board 411. A second container 414 is provided inside the case 412, and a first container 413 is provided inside the second container 414. The resonator 420 is mounted on an inner surface (lower side surface) of an upper surface of the first container 413. The circuit device 500 of the present embodiment, a heater 450, and a temperature sensor 460 are mounted on an outer surface (upper side surface) of the upper surface of the first container 413. For example, the temperature of the inside of the second container 414 can be adjusted by using the heater 450 (heat generation element). For example, the temperature of the inside of the second container 414 can be detected by using the temperature sensor 460.

The second container 414 is provided on a board 416. The board 416 is a circuit board on which various electronic components can be mounted. In the board 416, a heater 452 and a temperature sensor 462 are mounted on a rear side surface opposite to the surface on which the second container 414 is provided. For example, the temperature of a space between the case 412 and the second container 414 can be adjusted by using the heater 452 (heat generation element). The temperature of the space between the case 412 and the second container 414 can be detected by using the temperature sensor 462.

As heat generation elements of the heaters 450 and 452, for example, a heat generation power bipolar transistor, a heat generation heater MOS transistor, a heat generation resistor, or a Peltier element. Heat generation of the heaters 450 and 452 may be controlled by, for example, an oven controlled circuit of the circuit device 500. As the temperature sensors 460 and 462, for example, a thermistor, a diode, or the like may be used.

In FIG. 29, the temperature of the resonator 420 or the like can be adjusted with a thermostatic tank having a double oven structure, and thus it is possible to stabilize an oscillation frequency of the resonator 420.

Figure 30:
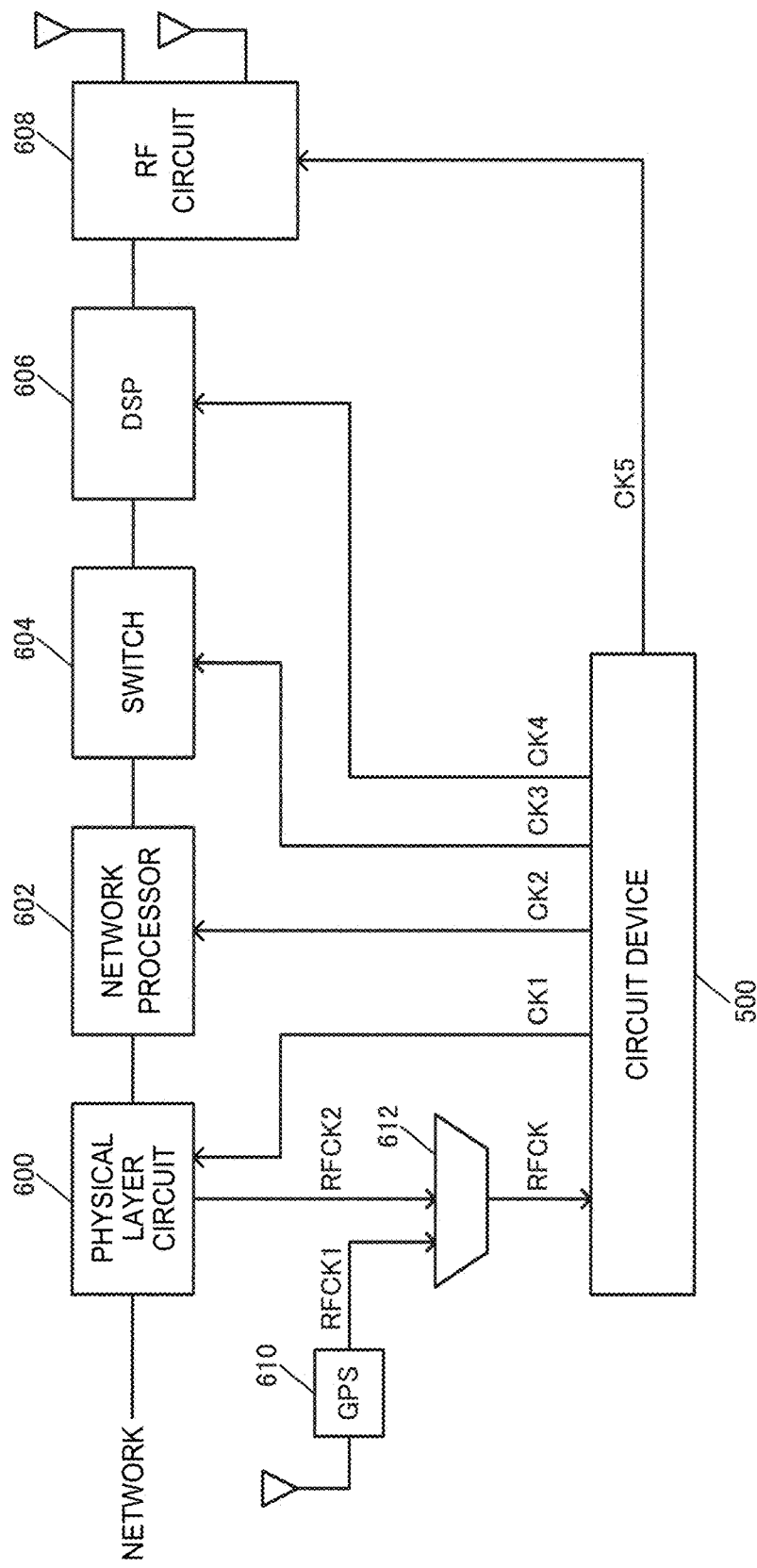
FIG. 30 is a diagram illustrating a configuration example of a base station which is one of the electronic apparatuses.

FIG. 30 illustrates a configuration example of a base station (base station apparatus) which is one of the electronic apparatuses. A physical layer circuit 600 performs a process on a physical layer in a communication process using a network. A network processor 602 performs a process on a higher-order layer (a link layer or the like) than the physical layer. A switch 604 performs various switching processes in the communication process. A DSP 606 performs various digital signal processes which are necessary in the communication process. An RF circuit 608 includes a reception circuit formed of a low noise amplifier (LNA), a transmission circuit formed of a power amplifier, a D/A converter, an A/D converter, and the like.

A selector 612 outputs either a reference signal RFCK1 from a GPS 610 or a reference signal RFCK2 (a clock signal from the network) from the physical layer circuit 600, to the circuit device 500 of the present embodiment as the reference signal RFCK. The circuit device 500 performs a process of synchronizing an oscillation signal (an input signal based on the oscillation signal) with the reference signal RFCK. Various clock signals CK1, CK2, CK3, CK4 and CK5 having different frequencies are generated, and are supplied to the physical layer circuit 600, the network processor 602, the switch 604, and the DSP 606, and the RF circuit 608.

According to the circuit device 500 of the present embodiment, in a base station as illustrated in FIG. 30, an oscillation signal can be synchronized with the reference signal RFCK, and the clock signals CK1 to CK5 having the high frequency stability, generated on the basis of the oscillation signal, can be supplied to the respective circuits of the base station.

Although the one or more embodiments have been described as above in detail, it can be easily understood by a person skilled in the art that various modifications without substantially departing from the new matters and effects of the one or more embodiments of the invention are possible. Therefore, these modifications are all included in the scope of the various embodiments of the invention. For example, in the specification or the drawings, the terminologies (for example, a temperature change component) which are mentioned at least once along with different terminologies (for example, a environmental change component) which have broader meanings or the same meanings may be replaced with the different terminologies in any location of the specification or the drawings. All combinations of the one or more embodiments and the modification examples are included in the scope of the various embodiments of the invention. In addition, configurations, operations, and the like of the circuit device, the oscillator, the electronic apparatus, and the vehicle, and the aging correction process, the Kalman filter process, the hold-over process, the temperature compensation process, and the like are also not limited to the above description of the one or more embodiments, and may have various modifications.

What is claimed is:

1. A circuit device comprising:
   an oscillation signal generation circuit that generates an oscillation signal having an oscillation frequency set by frequency control data by using a resonator;
   a processor that is configured to:
   perform a signal process on input frequency control data to output the frequency control data;
   obtain a pre-estimated value $x^{\sim}(k)$ at a time step k by adding a post-estimated value $x^{\wedge}(k-1)$ and a correction value $D(k-1)$ at a time step k−1 together during a process of updating a pre-estimated value in a Kalman filter process; and
   perform aging correction on the frequency control data on the basis of a result of the Kalman filter process.

2. The circuit device according to claim 1, wherein the processor is configured to obtain the correction value $D(k-1)$ on the basis of an observation residual in the Kalman filter process.

3. The circuit device according to claim 1, wherein the processor is configured to obtain the pre-estimated value $x^{\sim}(k)$ at the time step k according to $x^{\sim}(k)=x^{\wedge}(k-1)+D(k-1)$ by adding the post-estimated value $x^{\wedge}(k-1)$ and the correction value $D(k-1)$ at the time step k−1 together.

4. The circuit device according to claim 3, wherein the processor is configured to obtain the correction value $D(k)$ at the time step k on the basis of the correction value $D(k-1)$ at the time step k−1 and an observation residual ek in the Kalman filter process.

5. The circuit device according to claim 4, wherein, in a case where a constant is indicated by E, the processor is configured to obtain the correction value D(k) according to D(k)=D(k−1)+E·ek.

6. The circuit device according to claim 5, further comprising:

a storage that stores the constant E.

7. The circuit device according to claim 1, wherein the processor is configured to perform the signal process on the input frequency control data which is based on a phase comparison result between an input signal based on the oscillation signal and a reference signal, estimate a true value for an observed value of the input frequency control data through the Kalman filter process in a period before a hold-over state due to the absence or abnormality of the reference signal is detected, and generate aging-corrected frequency control data, in a case where the hold-over state is detected, by holding the true value at a timing corresponding to a timing of detecting the hold-over state, and by performing a calculation based on the true value.

8. The circuit device according to claim 7, wherein the processor is configured to generate the aging-corrected frequency control data by performing the calculation of adding the correction value to the true value.

9. The circuit device according to claim 8, wherein the processor is configured to perform the calculation of adding the correction value after a filter process to the true value.

10. The circuit device according to claim 1, further comprising:

a storage that stores a system noise constant for setting system noise in the Kalman filter process and an observation noise constant for setting observation noise in the Kalman filter process.

11. The circuit device according to claim 1, further comprising:

a digital interface that monitors the pre-estimated value and an observed value.

12. An oscillator comprising:

the circuit device according to claim 1; and the resonator.

13. An electronic apparatus comprising the circuit device according to claim 1.

14. A vehicle comprising the circuit device according to claim 1.

* * * * *